(12) United States Patent
Atkins et al.

(10) Patent No.: US 11,422,095 B2
(45) Date of Patent: Aug. 23, 2022

(54) SCATTEROMETRY MODELING IN THE PRESENCE OF UNDESIRED DIFFRACTION ORDERS

(71) Applicant: KLA-Tencor Corporation, Milpitas, CA (US)

(72) Inventors: Phillip Atkins, San Jose, CA (US); Liequan Lee, Fremont, CA (US); Shankar Krishnan, Santa Clara, CA (US); David C. S. Wu, Chupei (TW); Emily Chiu, Chupei (TW)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/286,315

(22) Filed: Feb. 26, 2019

(65) Prior Publication Data
US 2020/0232909 A1 Jul. 23, 2020

Related U.S. Application Data

(60) Provisional application No. 62/794,510, filed on Jan. 18, 2019.

(51) Int. Cl.
*G01N 21/956* (2006.01)
*G01N 21/25* (2006.01)
(Continued)

(52) U.S. Cl.
CPC ......... *G01N 21/956* (2013.01); *G01N 21/255* (2013.01); *G01N 21/47* (2013.01);
(Continued)

(58) Field of Classification Search
CPC .............. G01N 21/956; G01N 21/47; G01N 2201/121; G01N 2201/126; G03F 7/70625
See application file for complete search history.

(56) References Cited

U.S. PATENT DOCUMENTS

| 5,608,526 A | 3/1997 | Piwonka-Corle et al. |
| 5,859,424 A | 1/1999 | Norton et al. |

(Continued)

OTHER PUBLICATIONS

International Search Report and Written Opinion dated May 13, 2020 for PCT/US2020/013768.

*Primary Examiner* — Violeta A Prieto
(74) *Attorney, Agent, or Firm* — Suiter Swantz pc llo

(57) ABSTRACT

A metrology system may receive a model for measuring one or more selected attributes of a target including features distributed in a selected pattern based on regression of spectroscopic scatterometry data from a scatterometry tool for a range of wavelengths. The metrology system may further generate a weighting function for the model to de-emphasize portions of the spectroscopic scatterometry data associated with wavelengths at which light captured by the scatterometry tool when measuring the target is predicted to include undesired diffraction orders. The metrology system may further direct the spectroscopic scatterometry tool to generate scatterometry data of one or more measurement targets including fabricated features distributed in the selected pattern. The metrology system may further measure the selected attributes for the one or more measurement targets based on regression of the scatterometry data of the one or more measurement targets to the model weighted by the weighting function.

31 Claims, 11 Drawing Sheets

(51) Int. Cl.
  *G01N 21/47* (2006.01)
  *G03F 7/20* (2006.01)
  *G01N 21/95* (2006.01)

(52) U.S. Cl.
  CPC ..... *G01N 21/9501* (2013.01); *G03F 7/70625* (2013.01); *G01N 2201/121* (2013.01); *G01N 2201/126* (2013.01)

(56) References Cited

U.S. PATENT DOCUMENTS

| | | | |
|---|---|---|---|
| 6,429,943 | B1 | 8/2002 | Opsal et al. |
| 7,478,019 | B2 | 1/2009 | Zangooie et al. |
| 7,933,026 | B2 | 4/2011 | Opsal et al. |
| 9,291,554 | B2 | 3/2016 | Kuznetsov et al. |
| 10,824,071 | B2 * | 11/2020 | Lee .......................... G03F 1/72 |
| 11,156,548 | B2 * | 10/2021 | Nguyen ................. G03F 7/705 |
| 2002/0165636 | A1 * | 11/2002 | Hasan ................ G05B 23/0216 700/121 |
| 2006/0247818 | A1 * | 11/2006 | Hasan ................ G05B 23/0216 700/121 |
| 2007/0211260 | A1 | 9/2007 | Vuong et al. |
| 2008/0117411 | A1 | 5/2008 | Vuong et al. |
| 2014/0172394 | A1 | 6/2014 | Kuznetsov et al. |
| 2014/0340682 | A1 | 11/2014 | Kwak et al. |
| 2015/0204664 | A1 | 7/2015 | Bringoltz et al. |
| 2016/0327870 | A1 | 11/2016 | Rhe et al. |
| 2017/0023491 | A1 * | 1/2017 | Cao .................... G03F 7/70633 |
| 2017/0314913 | A1 * | 11/2017 | Krishnan ........... G01B 11/0641 |
| 2017/0315044 | A1 * | 11/2017 | Krishnan ............... G01N 21/00 |
| 2018/0129140 | A1 | 5/2018 | Cramer et al. |
| 2019/0148246 | A1 * | 5/2019 | Zhan .................... G06N 3/0454 438/14 |
| 2019/0178788 | A1 * | 6/2019 | Nguyen ................. G01N 21/211 |
| 2019/0285407 | A1 * | 9/2019 | Chuang ............. G03F 7/70625 |
| 2020/0110332 | A1 * | 4/2020 | Lee ........................ H01L 22/20 |

* cited by examiner

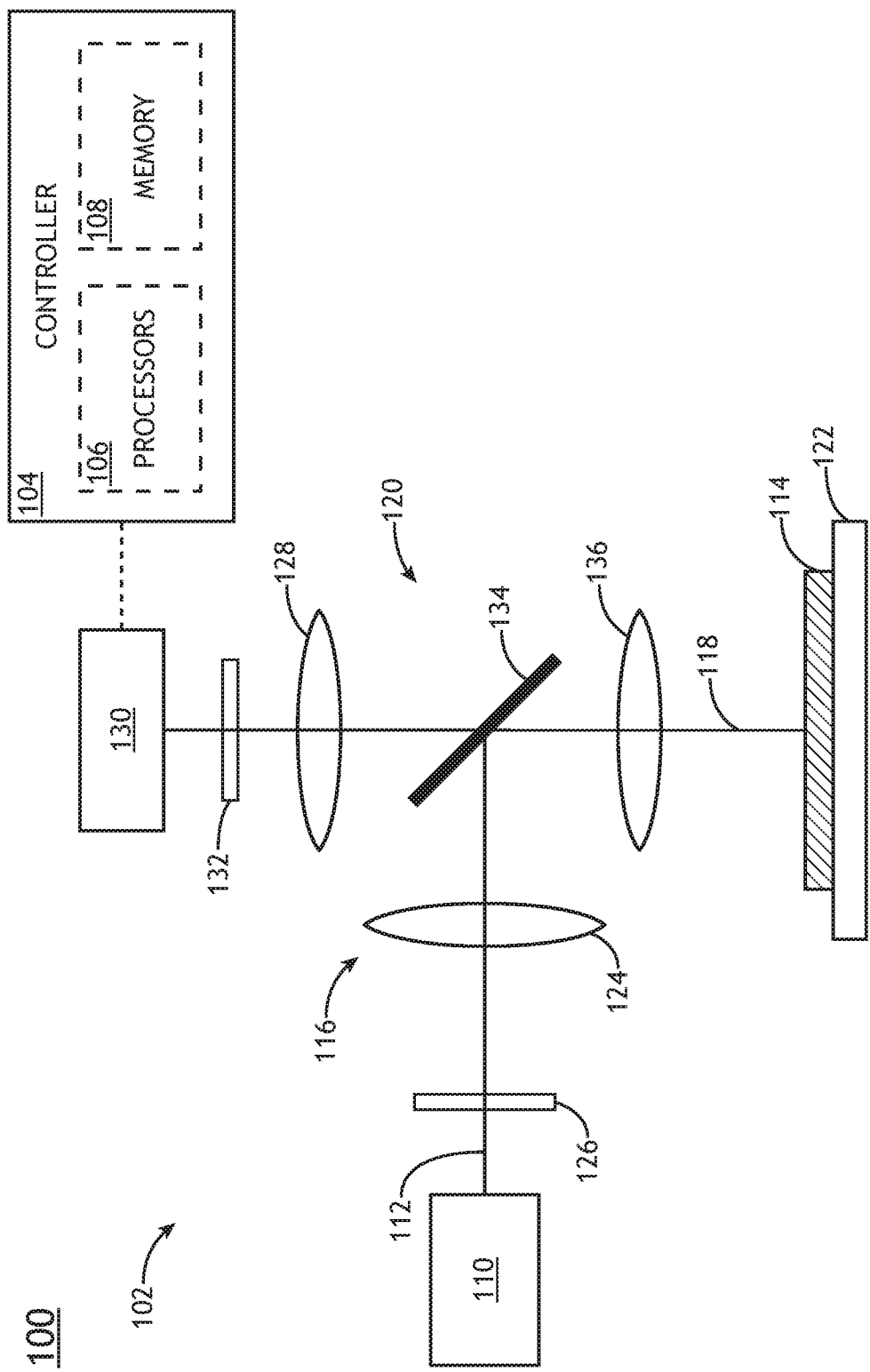

SCATTEROMETRY MODELING IN THE PRESENCE OF UNDESIRED DIFFRACTION ORDERS

CROSS-REFERENCE TO RELATED APPLICATION

The present application claims the benefit under 35 U.S.C. § 119(e) of U.S. Provisional Application Ser. No. 62/794,510, filed Jan. 18, 2019, entitled CD MODELING IN THE PRESENCE OF HIGHER DIFFRACTION ORDERS, naming Phillip Atkins, Liequan Lee, Krishnan Shankar, David Wu, and Emily Chiu as inventors, which is incorporated herein by reference in the entirety.

TECHNICAL FIELD

The present disclosure is related generally to scatterometry metrology and, more particularly, to spectroscopic scatterometry metrology.

BACKGROUND

Scatterometry provides metrology measurements based on analysis of the angles at which light emanates from a sample rather than analysis of an image of a sample. Light incident on a sample is reflected, scattered, and/or diffracted at various angles based on the structure and composition of features on a sample. Further, the angles and/or intensities of reflected, scattered, and/or diffracted light typically vary for different wavelengths of incident light. Accordingly, spectroscopic scatterometry captures scatterometry signals at multiple wavelengths to further characterize features on a sample.

Scatterometry metrology typically utilizes a model to relate scatterometry data (e.g., reflected, scattered, and/or diffracted light) to one or more attributes of the sample including, but not limited to, a physical dimension of a feature (e.g., a critical dimension (CD)), a feature height, separation distances between features on one or more sample layers, material properties of one or more sample layers, or optical properties of one or more sample layers.

It is typically desirable to limit the space on a sample dedicated to metrology in order to retain space for fabricated features of interest. One technique used for decreasing the size of metrology targets is to utilize a large numerical aperture when collecting light. However, it may be the case that a large numerical aperture may capture light associated with unwanted diffraction orders from a sample that may introduce noise into the fitting of scatterometry data to the model. It is therefore desirable to provide systems and methods that cure the above deficiencies.

SUMMARY

A metrology system is disclosed in accordance with one or more illustrative embodiments of the present disclosure. In one illustrative embodiment, the system includes a controller. In another illustrative embodiment, the controller receives a model for measuring one or more selected attributes of a target including one or more features distributed in a selected pattern based on regression of spectroscopic scatterometry data from a scatterometry tool for a selected range of wavelengths. In another illustrative embodiment, the controller generates a weighting function for the model to de-emphasize portions of the spectroscopic scatterometry data associated with one or more wavelengths within the selected range of wavelengths at which light captured by the scatterometry tool when measuring the target is predicted to include one or more undesired diffraction orders. In another illustrative embodiment, the controller directs the spectroscopic scatterometry tool to generate scatterometry data of one or more measurement targets for the selected range of wavelengths, where the one or more measurement targets include fabricated features distributed in the selected pattern. In another illustrative embodiment, the controller measures the one or more selected attributes for the one or more measurement targets based on regression of the scatterometry data of the one or more measurement targets to the model weighted by the weighting function.

A metrology system is disclosed in accordance with one or more illustrative embodiments of the present disclosure. In one illustrative embodiment, the system includes a scatterometry tool for generating spectroscopic scatterometry data of a target for a selected range of wavelengths. In another illustrative embodiment, the system includes a controller. In another illustrative embodiment, the controller receives a model for measuring one or more selected attributes of a target including one or more features distributed in a selected pattern based on regression of spectroscopic scatterometry data from the scatterometry tool for the selected range of wavelengths. In another illustrative embodiment, the controller generates a weighting function for the model to de-emphasize portions of the spectroscopic scatterometry data associated with one or more wavelengths within the selected range of wavelengths at which light captured by the scatterometry tool when measuring the target is predicted to include one or more undesired diffraction orders. In another illustrative embodiment, the controller directs the spectroscopic scatterometry tool to generate scatterometry data of one or more measurement targets for the selected range of wavelengths, where the one or more measurement targets include fabricated features distributed in the selected pattern. In another illustrative embodiment, the controller measures the one or more selected attributes for the one or more measurement targets based on regression of the scatterometry data of the one or more metrology targets to the model weighted by the weighting function.

A metrology method is disclosed in accordance with one or more illustrative embodiments of the present disclosure. In one illustrative embodiment, the method includes receiving a model for measuring one or more selected attributes of a target including one or more features distributed in a selected pattern based on regression of spectroscopic scatterometry data from a scatterometry tool for a selected range of wavelengths. In another illustrative embodiment, the method includes generating a weighting function for the model to de-emphasize portions of the spectroscopic scatterometry data associated with one or more wavelengths within the selected range of wavelengths at which light captured by the scatterometry tool when measuring the target is predicted to include one or more undesired diffraction orders. In another illustrative embodiment, the method includes directing the spectroscopic scatterometry tool to generate scatterometry data of one or more measurement targets for the selected range of wavelengths, where the one or more measurement targets include fabricated features distributed in the selected pattern. In another illustrative embodiment, the method includes measuring the one or more selected attributes for the one or more measurement targets based on regression of the scatterometry data of the one or more measurement targets to the model weighted by the weighting function.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 1C is a conceptual view of a scatterometry metrology tool configured with a common objective lens, in accordance with one or more embodiments of the present disclosure;

DETAILED DESCRIPTION

Figure 1A:
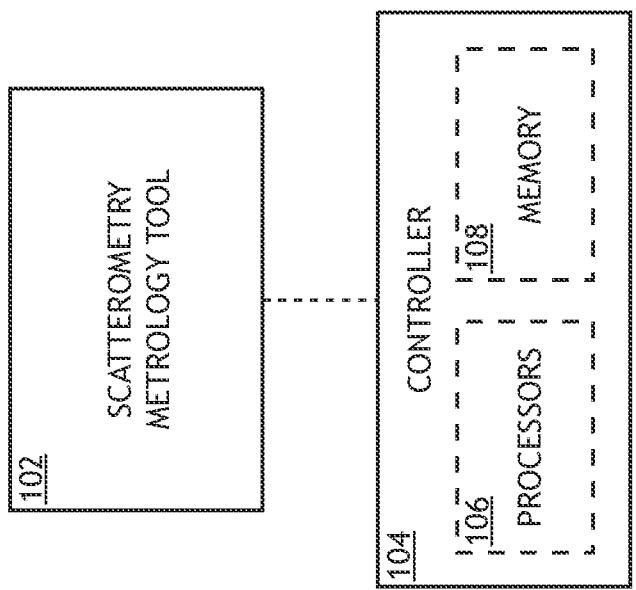
FIG. 1A is a block diagram view of a scatterometry metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for spectroscopic scatterometry incorporating a model for measuring one or more attributes of a sample based on scatterometry data including one or more desired diffraction orders and further incorporating weights to de-emphasize scatterometry data associated with undesired diffraction orders.

Scatterometry metrology tools typically illuminate a sample and capture (e.g., with a detector) the associated light emanating from the sample in a pupil plane. In this regard, the angle and intensity of light from the sample may be captured. This scatterometry data may then be related to any of a wide variety of attributes of a sample through a model. For example, features on a sample may reflect, scatter, and/or diffract incident light based on various physical or optical sample attributes such as, but not limited to a number of sample layers, a pattern (e.g., a distribution) of features on one or more of the layers, compositions of the layers, thicknesses of the layers, or optical properties of the layers. The model may thus incorporate various simulations and/or estimations of the interaction of incident light with the sample to provide a relationship between physical or optical attributes of the sample and corresponding scatterometry data. Further, since the scattering, reflection, and diffraction of light typically vary as a function of wavelength, a spectroscopic scatterometry tool may capture scatterometry signals for multiple wavelengths either simultaneously or sequentially.

It is typically the case that the physical or optical attributes of a fabricated sample differ from target values. Accordingly, the model may typically include one or more floating parameters such that scatterometry data associated with a fabricated sample may be fit to the model. In this regard, the resulting values of the floating parameters may be used to determine measured values of one or more attributes of the sample. For example, fitting scatterometry data to a model may provide measurements of one or more features such as, but not limited to, feature dimensions (e.g., a critical dimensions (CD)), feature heights, sidewall angles, separations between features on a selected sample layer (e.g., a pitch of distributed features), or separations between features on different layers (e.g., an overlay measurement). By way of another example, fitting scatterometry data to a model may provide measurements of one or more sample layers such as, but not limited to, layer thicknesses or refractive indices.

It may be the case that a scatterometry models for different applications (e.g., measurements of targets incorporating different features) may require different scatterometry data as inputs. For example, optical critical dimension (OCD) measurements may, but are not required to, utilize a model that incorporates scatterometry data associated with a scatterometry single diffraction order (e.g., 0-order). In this regard, scatterometry data associated with undesired diffraction orders (e.g., higher-order diffraction) may introduce noise when fitting to the model. In this regard, the undesired diffraction orders may contaminate the measurement and may lead to inaccuracies in the measurement.

It is recognized herein that spectroscopic scatterometry models may typically benefit from scatterometry data across a wide-bandwidth range in order to provide sufficient information for determining values of floating parameters accurately and precisely. However, in practice, it may be desirable to utilize a particular scatterometry tool (e.g., a particular spectroscopic scatterometry tool) to characterize targets that result in the collection of at least some undesired scatterometry data (e.g., associated with desired diffraction orders). Continuing the above example, it may be desirable to perform OCD measurements on targets having features distributed with a pitch sufficiently large that at least some higher-order diffraction is collected by a particular spectroscopic scatterometry tool for at least some wavelengths within the bandwidth of the tool. For example, the angle at which light diffracts from periodic features on a sample may generally decrease as the pitch increases and as the wavelength of light decreases. Accordingly, targets suitable for characterizing some state-of-the-art logic devices or static random-access memory (SRAM) devices may have features with sufficiently large pitch to result in the collection of at least some higher-order diffraction, particularly when using visible or ultraviolet (UV) light.

However, it is recognized herein that the impact of undesired scatterometry data may vary for different wavelengths. Embodiments of the present disclosure are directed to generating a weighting function for a scatterometry model to de-emphasize undesired scatterometry data (e.g., scatterometry data associated with undesired diffraction orders). Undesired scatterometry data may thus be utilized to the extent that it does not unduly impact the accuracy of the measurement, which may be determined based on any selected fitness metric. In this regard, the degree of contamination introduced at each wavelength may be balanced against the benefit of data across a wide spectral range to provide an accurate fit. For example, it is noted that it may be possible to simply exclude data for wavelengths that introduce (or are predicted to introduce) contamination. However, this approach may provide a close fit to the model based on a selected fitting metric, but the limited amount of collected data may actually decrease the accuracy of the measurement. In contrast, weighting scatterometry data based on the degree of contamination in accordance with embodiments of the present disclosure may result in highly accurate measurements in spite of the contamination.

Embodiments of the present disclosure include multiple systems and methods for generating weighting functions for a spectroscopic scatterometry model designed to relate spectroscopic scatterometry data from a selected spectroscopic scatterometry tool (e.g., one having a selected measurement bandwidth and numerical aperture) to one or more attributes of interest (e.g., a CD, or the like) of a test target (e.g., a measurement target). For example, a test target may include a known distribution of features in one or more sample layers.

In some embodiments, a weighting function is generated by measuring spectroscopic scatterometry data for a test-pitch target and at least one modified-pitch target. For example, a test-pitch target may be the same as a test target of interest, while the modified-pitch target may include features distributed according to the same pattern as the test target of interest but having pitch values small enough to avoid capture of undesired diffraction orders by the selected spectroscopic scatterometry tool. Further, the scatterometry data may be fit to the model and wavelength-dependent residuals may be determined. A wavelength-dependent weighting function may then be generated based on a ratio of the residuals of the modified-pitch target and the test-pitch target.

In some embodiments, a weighting function is generated based on estimations of the contamination at each wavelength, which may be generated using a variety of techniques including, but not limited to, ray-tracing techniques, or rigorous coupled-wave analysis (RCWA) techniques.

In some embodiments, a weighting function is generated based on a combination of multiple techniques. For example, the weighting function may be generated as, but is not limited to, a linear combination of multiple weighting techniques.

Referring now generally to FIG. 1A through 8, systems and methods for scatterometry metrology with weighted models are described in greater detail.

FIG. 1A is a block diagram view of a scatterometry metrology system 100, in accordance with one or more embodiments of the present disclosure.

In one embodiment, a scatterometry metrology system 100 includes a scatterometry metrology tool 102 for generating scatterometry data associated with one or more samples. The scatterometry metrology tool 102 may include any type of scatterometry metrology system known in the art suitable for providing scatterometry metrology signals at one or more wavelengths. For example, the scatterometry metrology tool 102 may include, but is not limited to, a spectrometer, a spectroscopic ellipsometer with one or more angles of illumination, a spectroscopic ellipsometer for measuring Mueller matrix elements (e.g., using rotating compensators), a spectroscopic reflectometer, or a scatterometer.

Further, the scatterometry metrology tool 102 may include a single metrology tool or multiple metrology tools. For example, a metrology tool including multiple hardware configurations is generally described in U.S. Pat. No. 7,933,026, which is incorporated herein by reference in its entirety. A metrology system incorporating multiple metrology tools is generally described in U.S. Pat. No. 7,478,019, which is incorporated herein by reference in its entirety. Focused beam ellipsometry based on primarily reflective optics is generally described in U.S. Pat. No. 5,608,526, which is incorporated herein by reference in its entirety. The use of apodizers to mitigate the effects of optical diffraction causing the spread of the illumination spot beyond the size defined by geometric optics is generally described in U.S. Pat. No. 5,859,424, which is incorporated herein by reference in its entirety. The use of high-numerical-aperture tools with simultaneous multiple angle-of-incidence illumination is generally described by U.S. Pat. No. 6,429,943, which is incorporated herein by reference in its entirety.

The scatterometry metrology tool 102 may generate scatterometry data associated with any location on a sample. In one embodiment, the scatterometry metrology tool 102 generates scatterometry data for device features on a sample. In this regard, the scatterometry metrology tool 102 may directly characterize features of interest. In another embodiment, the scatterometry metrology tool 102 generates scatterometry data for one or more metrology targets (e.g., targets) including fabricated features designed to be representative of the device features on the sample. In this regard, measurements of one or more metrology targets distributed across a sample may be attributed to the device features. For example, it may be the case that the size, shape, or distribution of sample features may not be suitable for accurate metrology measurements. In contrast, a metrology target may include features on one or more sample layers having sizes, shapes, and distributions tailored such that scatterometry data of the target is highly sensitive to one or more selected physical or optical attributes of the features. Scatterometry data of the target may then be related to specific values of the selected attributes (e.g., through a model).

Metrology targets may be designed to be sensitive to, and thus facilitate measurements of, a wide variety of physical or optical attributes including, but not limited to CD, overlay, sidewall angles, film thicknesses, film compositions, or process-related parameters (e.g. focus, dose, and the like). To this end, a metrology target may include any combination of periodic structures (e.g., one, two or three-dimensional periodic structures) or isolated non-periodic features. The use of a metrology tool to characterize non-periodic features is generally described in U.S. Pat. No. 9,291,554, granted on Mar. 22, 2016, which is incorporated herein by reference in its entirety. Further, a metrology target may generally be characterized having one or spatial frequencies (e.g., one or more pitches) that can be attributed to a pattern or distribution of features. The use of symmetric target design in scatterometry overlay metrology is generally described in U.S. Patent Publication No. 2015/0204664, published on Jul. 23, 2015, which is incorporated herein by reference in its entirety.

Metrology targets may be located at multiple sites on a sample. For example, targets may be located within scribe lines (e.g., between dies) and/or located in a die itself. Multiple targets may be measured simultaneously or serially by the same or multiple metrology tools as described in U.S. Pat. No. 7,478,019, which is incorporated herein by reference in its entirety.

In another embodiment, the scatterometry metrology system 100 includes a controller 104. In another embodiment, the controller 104 includes one or more processors 106 configured to execute program instructions maintained on a memory medium 108 (e.g., memory). In this regard, the one or more processors 106 of controller 104 may execute any of the various process steps described throughout the present disclosure. Further, the memory medium 108 may store any type of data for use by any component of the scatterometry metrology system 100. For example, the memory medium 108 may store recipes for the scatterometry metrology tool 102, scatterometry data generated by the scatterometry metrology tool 102, or the like.

The one or more processors 106 of a controller 104 may include any processing element known in the art. In this sense, the one or more processors 106 may include any microprocessor-type device configured to execute algorithms and/or instructions. In one embodiment, the one or more processors 106 may consist of a desktop computer, mainframe computer system, workstation, image computer, parallel processor, or any other computer system (e.g., networked computer) configured to execute a program configured to operate the scatterometry metrology system 100, as described throughout the present disclosure. It is further recognized that the term "processor" may be broadly defined to encompass any device having one or more processing elements, which execute program instructions from a non-transitory memory medium 108.

The memory medium 108 may include any storage medium known in the art suitable for storing program instructions executable by the associated one or more processors 106. For example, the memory medium 108 may include a non-transitory memory medium. By way of another example, the memory medium 108 may include, but is not limited to, a read-only memory, a random-access memory, a magnetic or optical memory device (e.g., disk), a magnetic tape, a solid-state drive and the like. It is further noted that memory medium 108 may be housed in a common controller housing with the one or more processors 106. In one embodiment, the memory medium 108 may be located remotely with respect to the physical location of the one or more processors 106 and controller 104. For instance, the one or more processors 106 of controller 104 may access a remote memory (e.g., server), accessible through a network (e.g., internet, intranet and the like). Therefore, the above description should not be interpreted as a limitation on the present invention but merely an illustration.

Additionally, the controller 104 and any associated components (e.g., the processors 106, the memory medium 108, or the like) may include one or more controllers housed in a common housing or within multiple housings. Further, the controller 104 may be integrated with and/or perform the functions of any components in the scatterometry metrology system 100.

The controller 104 may perform any number of processing or analysis steps disclosed herein including, but not limited to, receiving, generating, or applying a model to relate scatterometry data to selected attributes of sample features, which may involve a number of algorithms. For example, a metrology target may be modeled (parameterized) using any technique known in the art including, but not limited to, a geometric engine, a process modeling engine, or a combination thereof. The use of process modeling is generally described in U.S. Patent Publication No. 2014/0172394, which is incorporated herein by reference in its entirety. A geometric engine may be implemented, but is not required to be implemented, by AcuShape software, a product provided by KLA-TENCOR. By way of another example, optical interaction of an illumination beam with a metrology target on a sample may, but is not limited to, be modeled using an electro-magnetic (EM) solver. Further, the EM solver may utilize any method known in the art including, but not limited to, rigorous coupled-wave analysis (RCWA), finite element method analysis, method of moments analysis, a surface integral technique, a volume integral technique, or a finite-difference time-domain analysis.

The controller 104 may further analyze collected data from the scatterometry metrology tool 102 using any data fitting and optimization technique known in the art to apply the collected data to the model including, but not limited to libraries, fast-reduced-order models, regression, machine-learning algorithms such as neural networks, support-vector machines (SVM), dimensionality-reduction algorithms (e.g. principal component analysis (PCA), independent component analysis (ICA), local-linear embedding (LLE), and the like), sparse representation of data (e.g. Fourier or wavelet transforms, Kalman filters, algorithms to promote matching from same or different tool types, and the like). For example, data collection and/or fitting may be, but is not required to be, performed by the Signal Response Metrology (SRM), a product provided by KLA-TENCOR.

In another embodiment, the controller 104 analyzes raw data generated by the scatterometry metrology tool 102 using algorithms that do not include modeling, optimization and/or fitting (e.g. phase characterization, or the like). It is noted herein that computational algorithms performed by the controller may be, but are not required to be, tailored for metrology applications through the use of parallelization, distributed computation, load-balancing, multi-service support, design and implementation of computational hardware, or dynamic load optimization. Further, various implementations of algorithms may be, but are not required to be, performed by the controller 104 (e.g. though firmware, software, or field-programmable gate arrays (FPGAs), and the like), or one or more programmable optical elements associated with the scatterometry metrology tool 102.

Figure 1B:
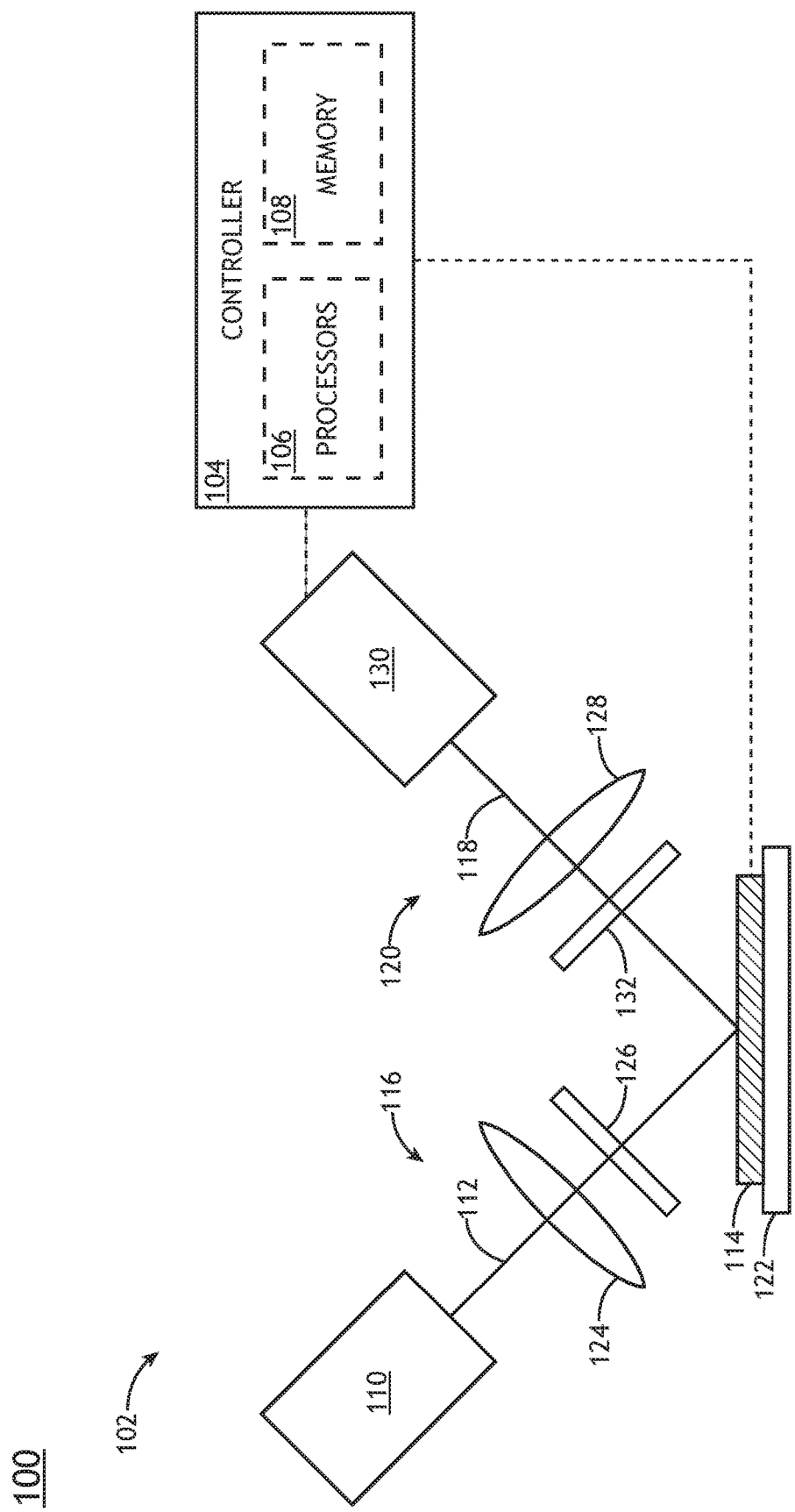
FIG. 1B a conceptual view of a scatterometry metrology tool, in accordance with one or more embodiments of the present disclosure.

FIG. 1B a conceptual view of a scatterometry metrology tool 102, in accordance with one or more embodiments of the present disclosure.

In one embodiment, the scatterometry metrology tool 102 includes an illumination source 110 to generate an illumination beam 112. The illumination beam 112 may include one or more selected wavelengths of light including, but not limited to, ultraviolet (UV) radiation, visible radiation, or infrared (IR) radiation.

In one embodiment, the illumination source 110 includes a laser source. For example, the illumination source 110 may include, but is not limited to, one or more narrowband laser sources, one or more broadband laser sources, one or more supercontinuum laser sources, one or more white light laser sources, or the like. Further, the illumination source 110 may include any type of laser source known in the art including, but not limited to, a diode laser source or a diode-pumped laser source.

In another embodiment, the illumination source 110 includes a lamp source. By way of another example, the illumination source 110 may include, but is not limited to, an arc lamp, a discharge lamp, an electrode-less lamp, and the like. In this regard, the illumination source 110 may provide an illumination beam 112 having low coherence (e.g., low spatial coherence and/or temporal coherence).

In another embodiment, the illumination source 110 includes a broadband plasma (BBP) illumination source. In this regard, the illumination beam 112 may include radiation emitted by a plasma. For example, a BBP illumination source 110 may include, but is not required to include, one or more pump sources (e.g., one or more lasers) configured to focus into the volume of a gas, causing energy to be absorbed by the gas in order to generate or sustain a plasma suitable for emitting radiation. Further, at least a portion of the plasma radiation may be utilized as the illumination beam 112.

In another embodiment, the illumination source 110 provides a tunable illumination beam 112. For example, the illumination source 110 may include a tunable source of illumination (e.g., one or more tunable lasers, and the like). By way of another example, the illumination source 110 may include a broadband illumination source coupled to a tunable filter.

The illumination source 110 may further provide an illumination beam 112 having any temporal profile. For example, the illumination beam 112 may have a continuous temporal profile, a modulated temporal profile, a pulsed temporal profile, or the like.

In another embodiment, the illumination source 110 directs the illumination beam 112 to a sample 114 via an illumination pathway 116 and collects light emanating from the sample (e.g., collected light 118) via a collection pathway 120. The collected light 118 may include any combination of light from the sample 114 generated in response to the incident illumination beam 112 such as, but not limited to, reflected light, scattered light, diffracted light, or luminescence of the sample 114.

In another embodiment, the sample 114 is located on a sample stage 122. The sample stage 122 may include any type of translation stage known in the art suitable for aligning one or more features on the sample 114 (e.g., a target) within the scatterometry metrology tool 102 for performing a scatterometry measurement. For example, the sample stage 122 may include any combination of a linear translation stage, a rotational stage, or a tip/tilt stage.

In one embodiment, the illumination pathway 116 may include an illumination focusing element 124 to focus the illumination beam 112 onto the sample 114. The illumination pathway 116 may include one or more illumination beam conditioning components 126 suitable for modifying and/or conditioning the illumination beam 112. For example, the one or more illumination beam conditioning components 126 may include, but are not limited to, one or more polarizers, one or more filters, one or more beam splitters, one or more apodizers, or one or more beam shapers, one or more diffusers, one or more homogenizers, or one or more lenses.

In another embodiment, the collection pathway 120 may include a collection focusing element 128 to capture the collected light 118 from the sample 114. In another embodiment, the scatterometry metrology system 100 includes a detector 130 configured to detect at least a portion of the collected light 118 emanating from the sample 114 through the collection pathway 120. The detector 130 may include any type of optical detector known in the art suitable for measuring illumination received from the sample 114. For example, a detector 130 may include, but is not limited to, a CCD detector, a CMOS detector, a TDI detector, a photomultiplier tube (PMT), an avalanche photodiode (APD), and the like. In another embodiment, a detector 130 may include a spectroscopic detector suitable for identifying wavelengths of radiation emanating from the sample 114.

The collection pathway 120 may further include any number of collection beam conditioning elements 132 to direct and/or modify illumination collected by the collection focusing element 128 including, but not limited to one or more lenses, one or more filters, one or more polarizers, or one or more phase plates.

In another embodiment, the scatterometry metrology tool 102 depicted in FIG. 1B may facilitate multi-angle illumination of the sample 114, and/or more than one illumination source 110 (e.g., coupled to one or more additional detectors 130). In this regard, the scatterometry metrology tool 102 depicted in FIG. 1B may perform multiple metrology measurements. In another embodiment, the scatterometry metrology tool 102 may include multiple detectors 130 to facilitate multiple metrology measurements (e.g., multiple metrology tools) by the scatterometry metrology tool 102.

Further, the scatterometry metrology tool 102 may facilitate multi-angle illumination of the sample 114, and/or more than one illumination source 110. In this regard, the scatterometry metrology tool 102 may perform multiple metrology measurements. In another embodiment, one or more optical components may be mounted to a rotatable arm (not shown) pivoting around the sample 114 such that the angle of incidence of the illumination beam 112 on the sample 114 may be controlled by the position of the rotatable arm.

In some embodiments, one or more components are common to both the illumination pathway 116 and the collection pathway 120. FIG. 1C is a conceptual view of a scatterometry metrology tool 102 configured with a common objective lens, in accordance with one or more embodiments of the present disclosure. In one embodiment, the scatterometry metrology tool 102 includes a beamsplitter 134 oriented such that an objective lens 136 may simultaneously direct the illumination beam 112 to the sample 114 and capture the collected light 118 emanating from the sample 114. In this regard, the objective lens 136 may operate in place of or along with the illumination focusing element 124 and/or the collection focusing element 128 of FIG. 1B Referring generally to FIGS. 1A through 1C, the controller 104 may be communicatively coupled to any component of the scatterometry metrology system 100. In one embodiment, the controller 104 is communicatively coupled to the illumination source 110 to provide one or more selected wavelengths of illumination for scatterometry measurements. In another embodiment, the controller 104 is configured to one or more elements of the illumination pathway 116 to direct the adjustment of the angle of incidence between the illumination beam 112 and the sample 114.

Figure 2:
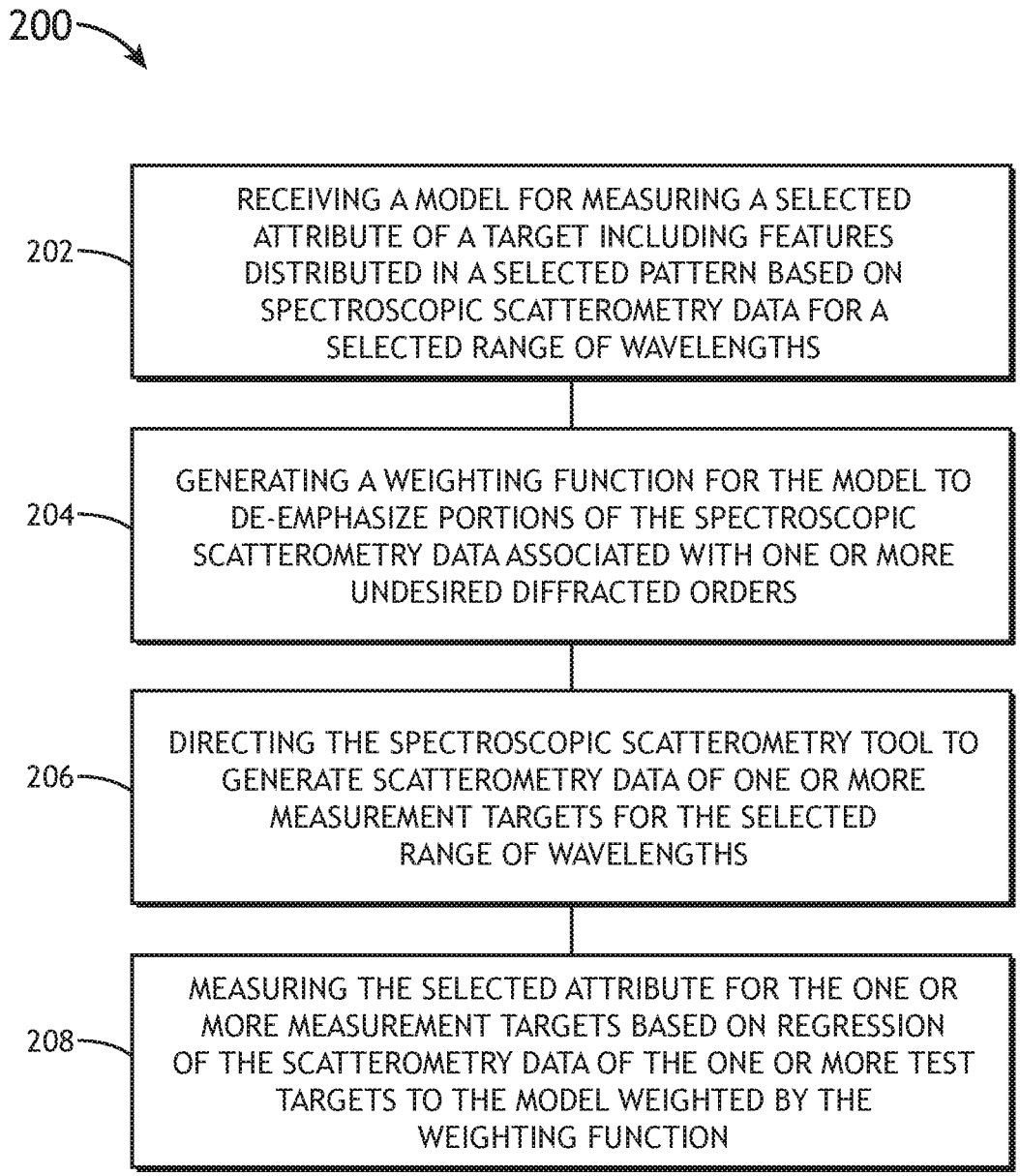
FIG. 2 is a flow diagram illustrating steps performed in a method for scatterometry metrology, in accordance with one or more embodiments of the present disclosure.

FIG. 2 is a flow diagram illustrating steps performed in a method 200 for scatterometry metrology, in accordance with one or more embodiments of the present disclosure. Applicant notes that the embodiments and enabling technologies described previously herein in the context of the scatterometry metrology system 100 should be interpreted to extend to method 200. It is further noted, however, that the method 200 is not limited to the architecture of the scatterometry metrology system 100.

In one embodiment, the method includes a step 202 of receiving a model for measuring a selected attribute of a target including features distributed in a selected pattern based on spectroscopic scatterometry data for a selected range of wavelengths.

As described previously herein in the context of the scatterometry metrology system 100, but not limited to the architecture of the scatterometry metrology system 100, a scatterometry model may relate scatterometry data to one or more attributes of a target (e.g., a metrology target). For example, the target may be modeled using any technique known in the art including, but not limited to, a geometric engine, a process modeling engine, or a combination thereof.

In one embodiment, the model is suitable for measuring one or more selected attributes of a particular measurement target of interest (e.g., a measurement target) including features distributed in a selected pattern. For example, the measurement target may correspond to a metrology target designed to provide measurements relevant to and representative of a particular type of device feature being fabricated on the same sample. In this regard, the model may incorporate various physical attributes of the measurement target of interest such as, but not limited to, a number of sample layers, CDs of features in any sample layer, heights of features in any sample layer, separation distances between features (e.g., pitches associated with periodically-distributed features), or sidewall angles. The model may further incorporate various optical attributes of the measurement target of interest such as, but not limited to, thicknesses or compositions of one or more sample layers.

The model may be based on any number of simulations and/or estimations of the interaction of the illumination beam 112 with the target of interest to determine the scattering, reflection, and/or diffraction of the illumination beam 112. For example, optical interaction of an illumination beam with a metrology target on a sample may, but is not limited to, be modeled using an electro-magnetic (EM) solver. Further, the EM solver may utilize any method known in the art including, but not limited to, rigorous coupled-wave analysis (RCWA), finite element method analysis, method of moments analysis, a surface integral technique, a volume integral technique, or a finite-difference time-domain analysis.

In one embodiment, the model received in step 202 is tailored or otherwise suitable for use with a particular spectroscopic scatterometry tool. For example, the model may be suitable for use with the spectral range of the illumination source 110. By way of another example, the model may incorporate the numerical aperture of the illumination pathway 116 and/or the collection pathway 120. In this regard, the model may take into account the characteristics of the scatterometry metrology tool 102 to provide an accurate relationship between attributes of the target expected scatterometry data (e.g., signals generated by the detector 130).

In another embodiment, the model includes one or more floating parameters such that scatterometry data may be fit to the model to determine specific values of the floating parameters, which may then be related to specific values of the selected attributes of the target. Accordingly, fitting the scatterometry data to the model may provide a measurement of any number of physical or optical attributes of the target.

Scatterometry data may be fit to the model using any technique known in the art such as, but not limited to, libraries, fast-reduced-order models, regression, machine-learning algorithms such as neural networks, support-vector machines (SVM), dimensionality-reduction algorithms (e.g. principal component analysis (PCA), independent component analysis (ICA), local-linear embedding (LLE), and the like), sparse representation of data (e.g. Fourier or wavelet transforms, Kalman filters, algorithms to promote matching from same or different tool types, and the like). In one embodiment, scatterometry data may be fit to the model using a maximum likelihood estimation (MLE) regression technique. In this regard, values of floating parameters may be determined based on an input dataset by maximizing a likelihood function.

The model of step 202 may be received by any source. In one embodiment, the model is received from an external source (e.g., an external server, an external controller, or the like). In another embodiment, the model is generated at least in part by the controller 104. In this regard, one or more aspects of the model may be stored in, and received from, the memory medium 108.

In another embodiment, the method includes a step 204 of generating a weighting function for the model to de-emphasize portions of the spectroscopic scatterometry data associated with one or more undesired diffraction orders. For example, it may be the case that the measurement target of interest may have features distributed with pitches (e.g., spatial frequencies) that result in the collection of undesired diffraction orders when measured with the scatterometry metrology tool 102.

It is recognized herein that the difference between desired and undesired diffraction orders may vary based on the specific model and/or the specific attribute of interest being measured. Accordingly, the examples herein should be interpreted as illustrative rather than limiting. In one embodiment, the one or more desired diffraction orders include a single diffraction order such that the undesired diffraction orders include the remaining diffraction orders generated under the measurement conditions provided by the scatterometry metrology tool 102. For example, as described previously herein in the context of an OCD scatterometry tool, but not limited to an OCD scatterometry tool, the one or more desired diffraction orders may include a single diffraction order (e.g., the 0-order) such that the undesired diffraction orders are associated with higher-order diffraction. In another embodiment, the one or more desired diffraction orders include two or more diffraction orders.

The portions of the spectroscopic scatterometry data associated with one or more undesired diffraction orders may be determined using any technique known in the art. For example, the step 204 may include predicting, using any combination of simulations, estimations, or measurements of reference targets, which wavelengths of the illumination beam 112 may lead to undesired diffraction orders of light being captured by the scatterometry metrology tool 102.

Further, the step 204 may include predictions of the extent to which the undesired diffraction orders would introduce noise into the fit and introduce measurement inaccuracies. In this regard, the weighting function may variably de-emphasize scatterometry data associated with wavelengths based on the predicted impact. Accordingly, scatterometry data associated with wavelengths causing undesired diffraction orders having a relatively higher impact may be suppressed to a greater extent than scatterometry data associated with wavelengths causing undesired diffraction orders having a relatively lower impact.

In another embodiment, the method includes a step 206 of directing the spectroscopic scatterometry tool to generate scatterometry data of one or more measurement targets (e.g., measurement targets of interest) for the selected range of wavelengths. For example, the one or more measurement targets may be located on samples of interest. In another embodiment, the method includes a step 208 of measuring the selected attribute for the one or more measurement targets based on regression of the scatterometry data of the one or more test targets to the model weighted by the weighting function. Accordingly, the model received in step 202 and modified by the weighting function of step 204 may be applied to measure any selected attributes (e.g., physical and/or optical attributes) on any number of measurement targets of interest on any number of samples of interest.

In another embodiment, though not shown, the measurements of the selected attributes may be provided to one or more additional process tools as feedback and/or feedforward data. For example, the measurements of selected attributes on measurement targets in a lot may be provided to one or more process tools (e.g., semiconductor fabrication tools) as feedback data to mitigate any process deviations for samples in the same lot or different lots. By way of another example, the measurements of selected attributes on measurement targets in a lot may be provided to one or more process tools as forward data to compensate for any process deviations identified for the current lot.

Figure 3:
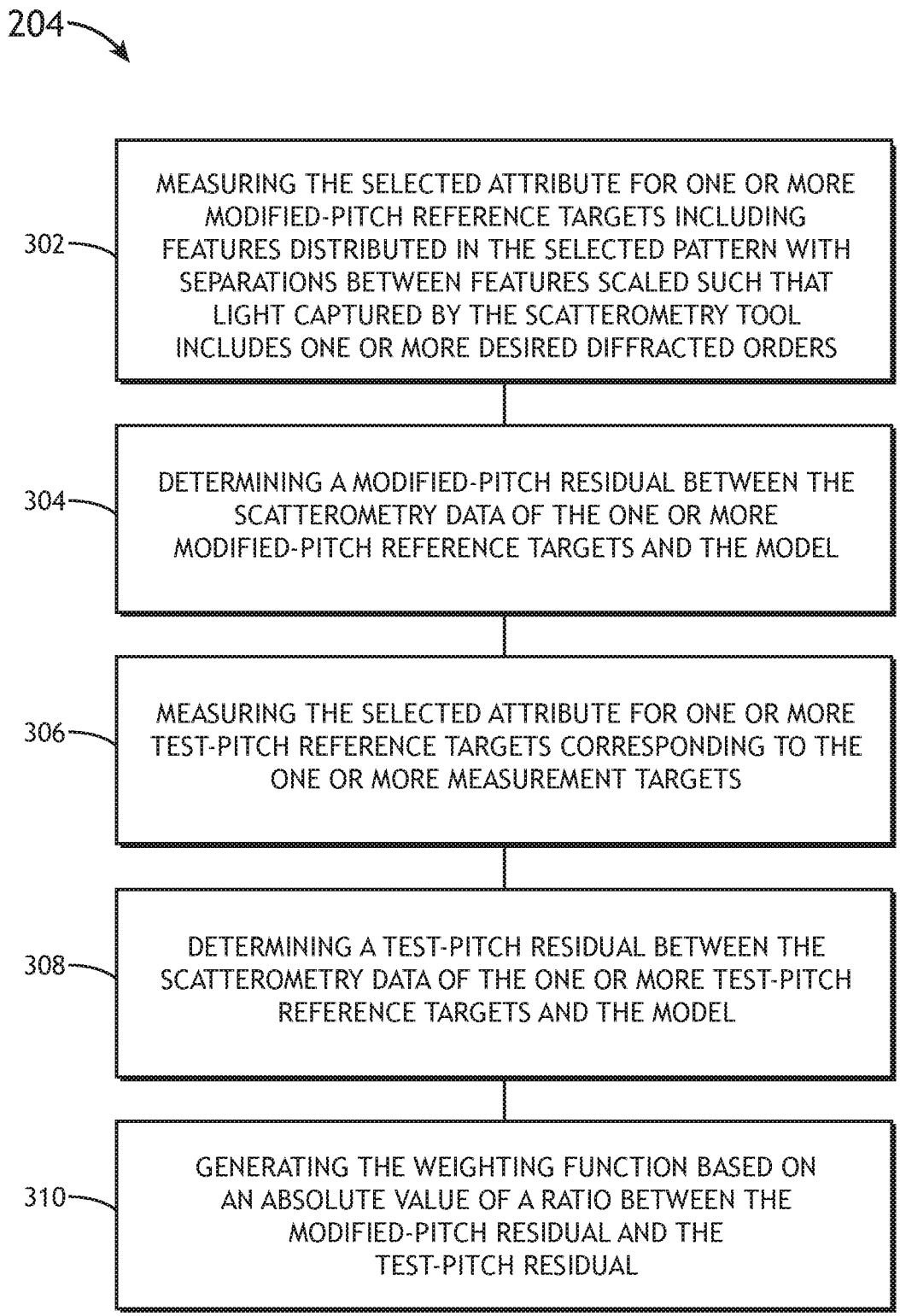
FIG. 3 is a flow diagram illustrating sub-steps associated with generating a weighting function based on measurements of reference targets, in accordance with one or more embodiments of the present disclosure.
Figure 6:
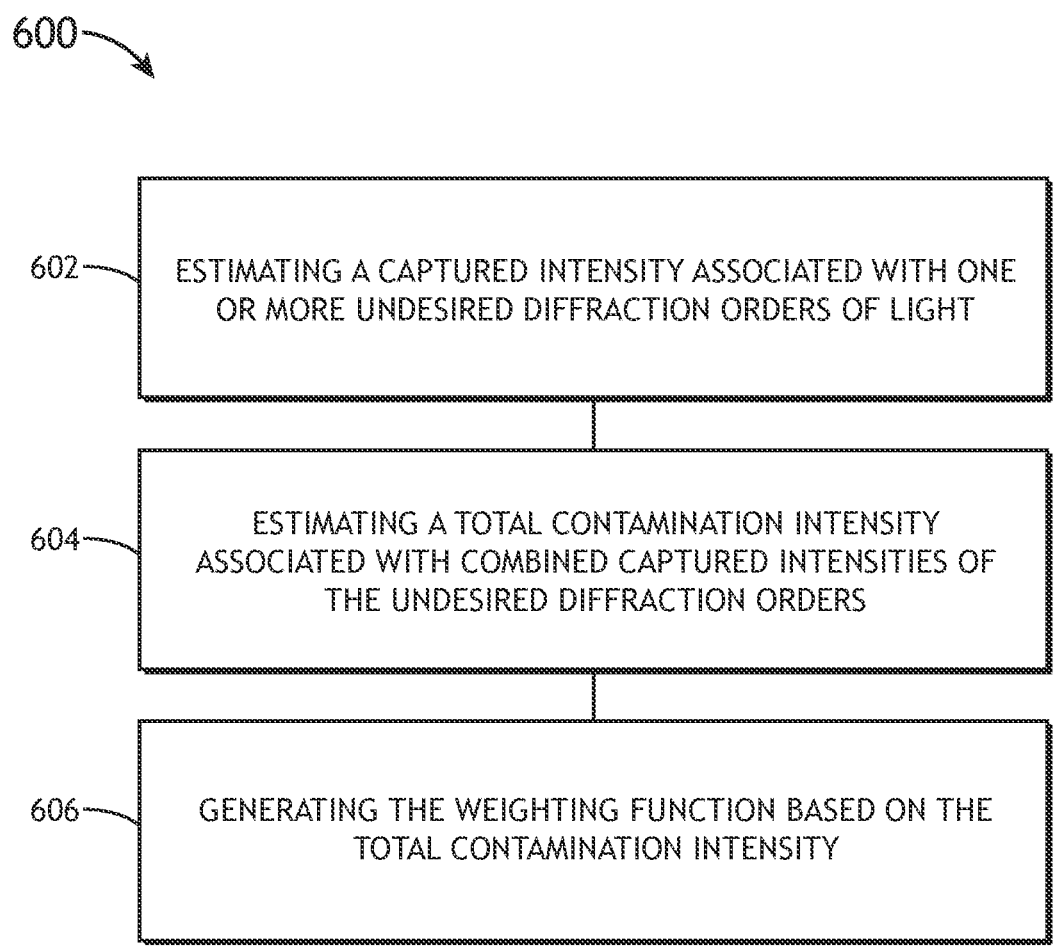
FIG. 6 is a flow diagram illustrating sub-steps for generating a weighting function based on estimating a total contamination intensity associated with portions of undesired diffracted orders captured by the scatterometry metrology tool, in accordance with one or more embodiments of the present disclosure.
Figure 7:
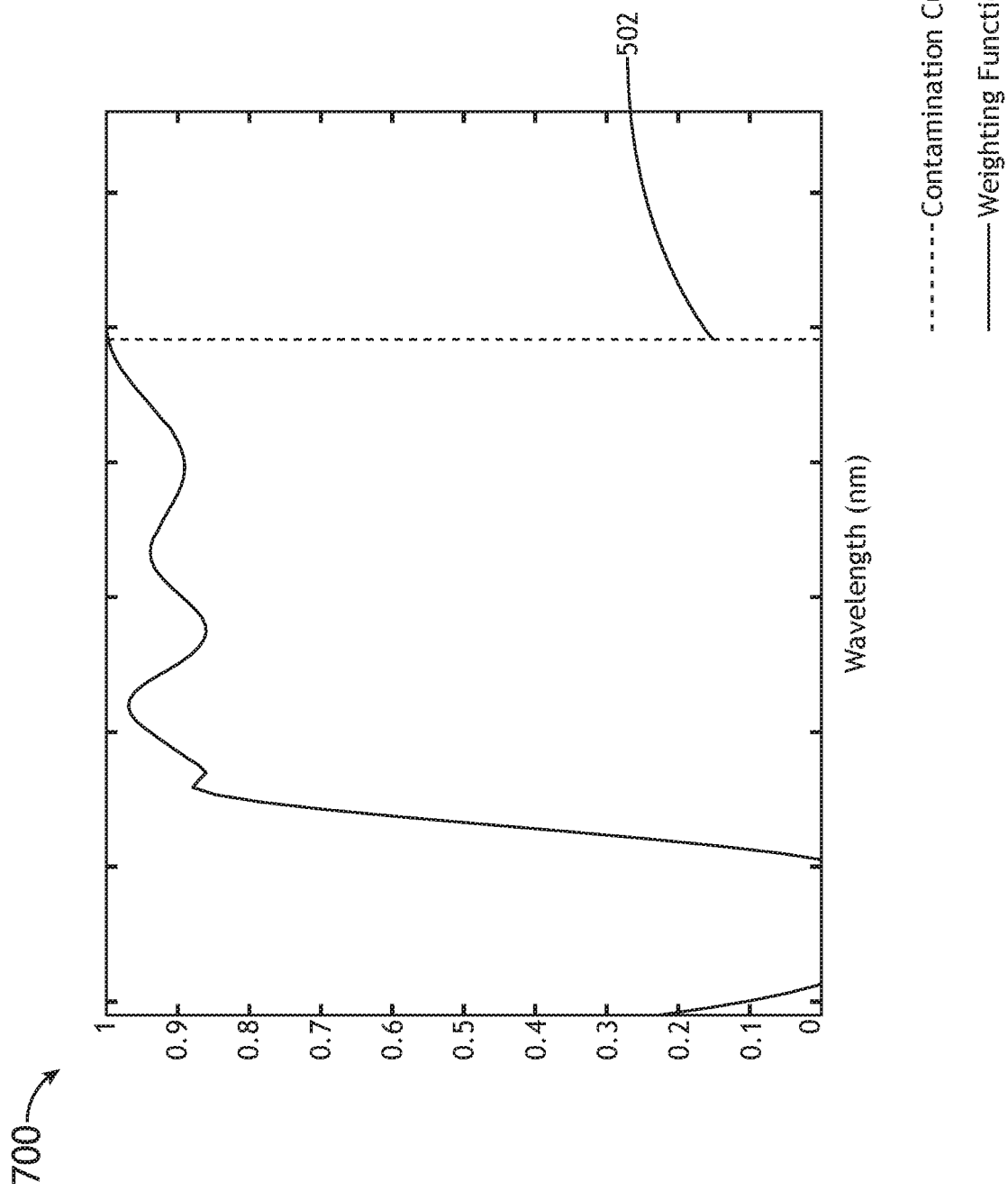
FIG. 7 is a plot illustrating weights generated based on an estimated total contamination intensity associated with measurement of the test-pitch target 402 illustrated in FIG. 4A, in accordance with one or more embodiments of the present disclosure.

Referring again to step 204, it is noted herein that weighting functions for de-emphasizing scatterometry data based on the predicted impact may be generated in various ways in accordance with the present disclosure. FIGS. 3 through 5 generally illustrate a weighting function based on measurements of reference targets including at least one reference target having feature separations modified to be free of undesired diffraction orders. FIGS. 6 and 7 generally illustrate a weighting function based on theoretical estimates of the impact of high-order diffraction. Further, as will be described in greater detail below with respect to FIG. 8, a weighting function may include a combination (e.g., a linear combination) of two or more weighting schemes.

FIG. 3 is a flow diagram 300 illustrating sub-steps associated with generating a weighting function based on measurements of reference targets, in accordance with one or more embodiments of the present disclosure. For example, the flow diagram 300 may represent sub-steps associated with step 204 of FIG. 2.

In one embodiment, step 204 includes a sub-step 302 of measuring the selected attribute for one or more modified-pitch reference targets. For example, a modified-pitch reference target may include the same or substantially the same pattern of features as the measurement target of interest, but with the separation distances modified and/or scaled to limit diffraction to the desired diffraction orders. In this regard, a modified-pitch reference target may mimic the materials and geometries of the measurement target of interest to the extent possible or practical to provide an accurate representation of the measurement target, while also limiting diffraction to the desired orders.

In another embodiment, step 204 includes a sub-step 304 of determining a modified-pitch residual (e.g., as a function of wavelength) between the scatterometry data of the one or more modified-pitch reference targets and the model.

Any number of modified-pitch reference targets may be measured in sub-step 302. In one embodiment, a single modified-pitch reference target is measured in sub-step 302. Accordingly, the modified-pitch residual may be represented as the residual between the scatterometry data of the single modified-pitch reference target and the model for each wavelength. In another embodiment, multiple modified-pitch reference targets are measured in sub-step 302. For example, multiple modified-pitch reference targets may be fabricated with variations of various physical or optical attributes that may be expected to occur through deviations of the fabrication process. Accordingly, the modified-pitch residual may be represented by a statistical combination (e.g., an average value, median value, or the like) of the residuals between the scatterometry data of the one or more modified-pitch reference targets and the model for each wavelength.

In another embodiment, step 204 includes a sub-step 306 of measuring the selected attribute for one or more test-pitch reference targets corresponding to the one or more measurement targets. For example, a test-pitch reference target may have features distributed in the same pattern as measurement targets of interest and at the same scale as the measurement targets of interest. In this regard, the test-pitch reference targets may be the same as or otherwise fully mimic measurement targets of interest.

In another embodiment, step 204 includes a sub-step 308 of determining a test-pitch residual (e.g., as a function of wavelength) between the scatterometry data of the one or more modified-pitch reference targets and the model.

Any number of test-pitch reference targets may be measured in sub-step 306. In one embodiment, a single test-pitch reference target is measured in sub-step 306. Accordingly, the test-pitch residual may be represented as the residual between the scatterometry data of the single test-pitch reference target and the model for each wavelength. In another embodiment, multiple test-pitch reference targets are measured in sub-step 306. For example, multiple test-pitch reference targets may be fabricated with variations of various physical or optical attributes that may be expected to occur through deviations of the fabrication process. Accordingly, the test-pitch residual may be represented by a statistical combination (e.g., an average value, median value, or the like) of the residuals between the scatterometry data of the one or more test-pitch reference targets and the model for each wavelength.

It is noted herein that any weighting scheme may be used for measurement and regression of modified-pitch reference targets (e.g., in sub-step 302) and the test-pitch reference targets (e.g., in sub-step 306) to determine the associated modified-pitch and test-pitch residuals. Further, the weighting scheme used to generate the modified-pitch residual may be the same as or different than the weighting scheme used to generate the test-pitch residual. In this regard, it is recognized herein that a weighting scheme tailored for determining the modified-pitch residual based on measurements of modified-pitch reference targets may not necessarily be equally-well tailored for determining the test-pitch residual based on measurements of the test-pitch reference targets.

In one embodiment, a uniform weighting scheme is used to generate the modified-pitch residual and/or the test-pitch residual. In another embodiment, a wavelength and/or system-dependent weighting scheme is used to generate the modified-pitch residual and/or the test-pitch residual. For example, the weighting scheme may be tailored to a particular scatterometry metrology tool 102 that compensates for any known signal deviations. By way of another example, the weighting scheme may be, but is not required to be, limited to only wavelengths at which no contamination of undesired diffraction orders is expected to occur. Since the modified-pitch and the test-pitch residuals are provided as inputs for the contamination-senstive weighting function (e.g., see sub-step 310 below), limiting information from wavelengths associated with contamination (or predicted contamination) may not affect the performance of the resulting weighting function.

In another embodiment, step 204 includes a sub-step 310 of generating the weighting function based on a ratio of the modified-pitch residual and the test-pitch residual.

It is recognized herein that there are three primary sources of error contributing to the calculation of residuals associated with fitting scatterometry data to the model: modeling error, contamination associated with undesired diffraction orders, and various unmodeled errors (e.g., calibration errors, and the like). In the case that the modeling error and the various unmodeled errors may be estimated or otherwise accounted for, difference between the residuals (e.g., the modified-pitch residual and the test-pitch residual) may account for the error associated with the contamination by undesired diffraction orders. Accordingly, comparing (e.g., via a ratio) the modified-pitch residual and the test-pitch residual at each wavelength may provide an estimation of the impact of contamination at each wavelength, which may then be used to weight the fitting of the scatterometry data to the model.

In one embodiment, the weighting function ($W_{res}(\lambda)$) is represented as an absolute value of the ratio between the modified-pitch residual and the test-pitch residual as described by Equation 1:

$$W_{Res}(\lambda) = \left\| \frac{R_{MP}(\lambda)}{R_{TP}(\lambda)} \right\|, \quad (1)$$

where $R_{MP}(\lambda)$ represents the modified-pitch residual, $R_{TP}(\lambda)$ represents the test-pitch residual, and $\lambda$ represents wavelengths within the spectrum of the scatterometry metrology tool 102. Further, the weighting function ($W_{Res}(\lambda)$) may be bounded between values of 0 and 1.

Figure 4A:
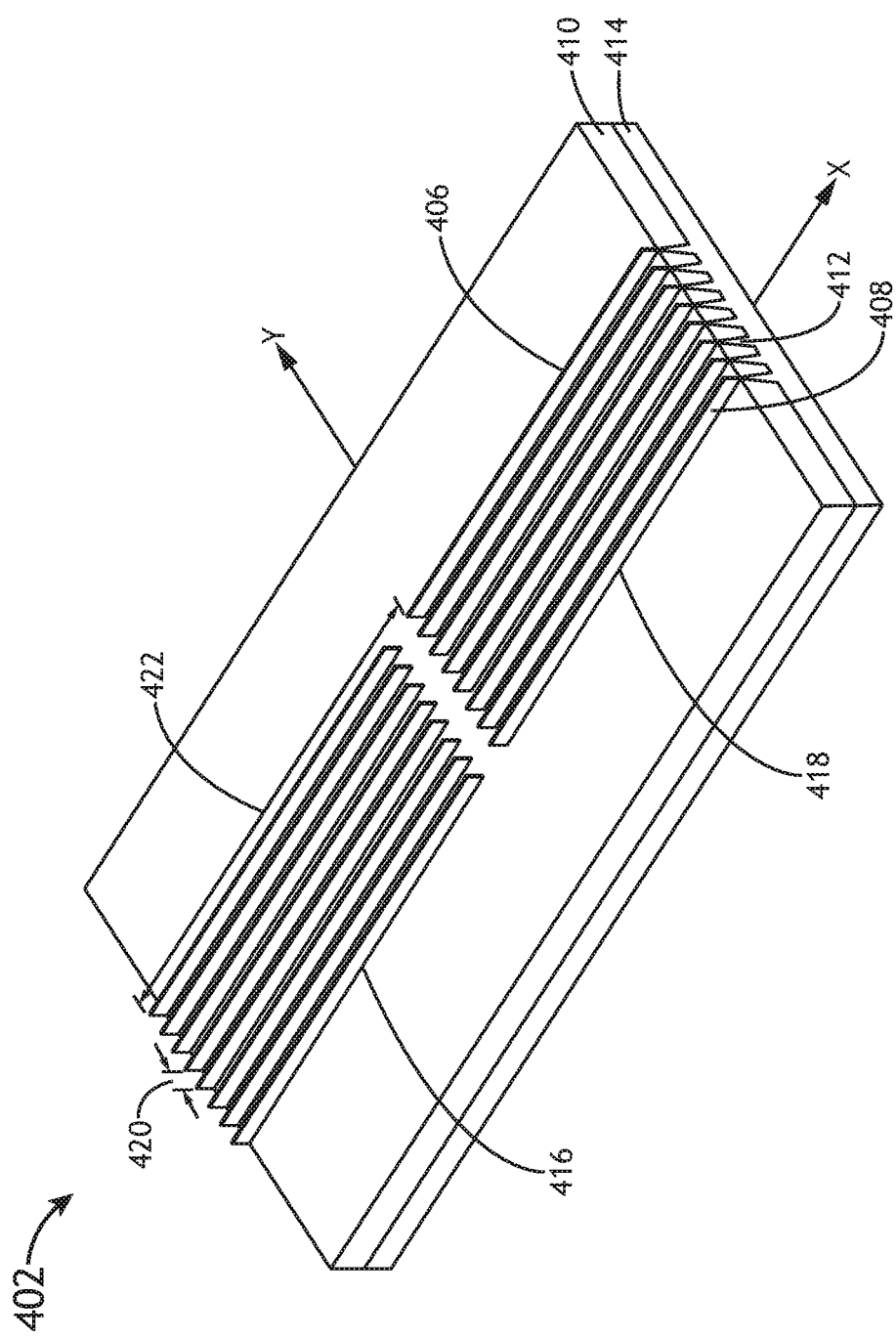
FIG. 4A is a perspective view of a test-pitch target, in accordance with one or more embodiments of the present disclosure.
Figure 4B:
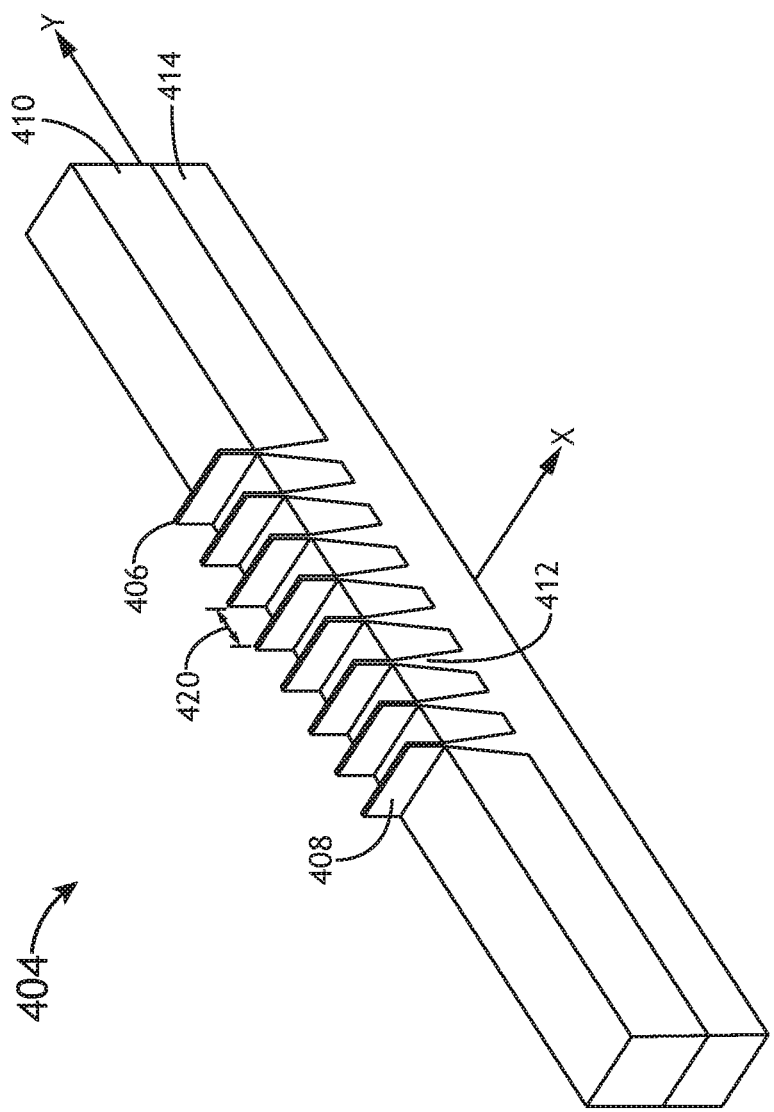
FIG. 4B is a perspective view of a modified-pitch target, in accordance with one or more embodiments of the present disclosure.
Figure 5:
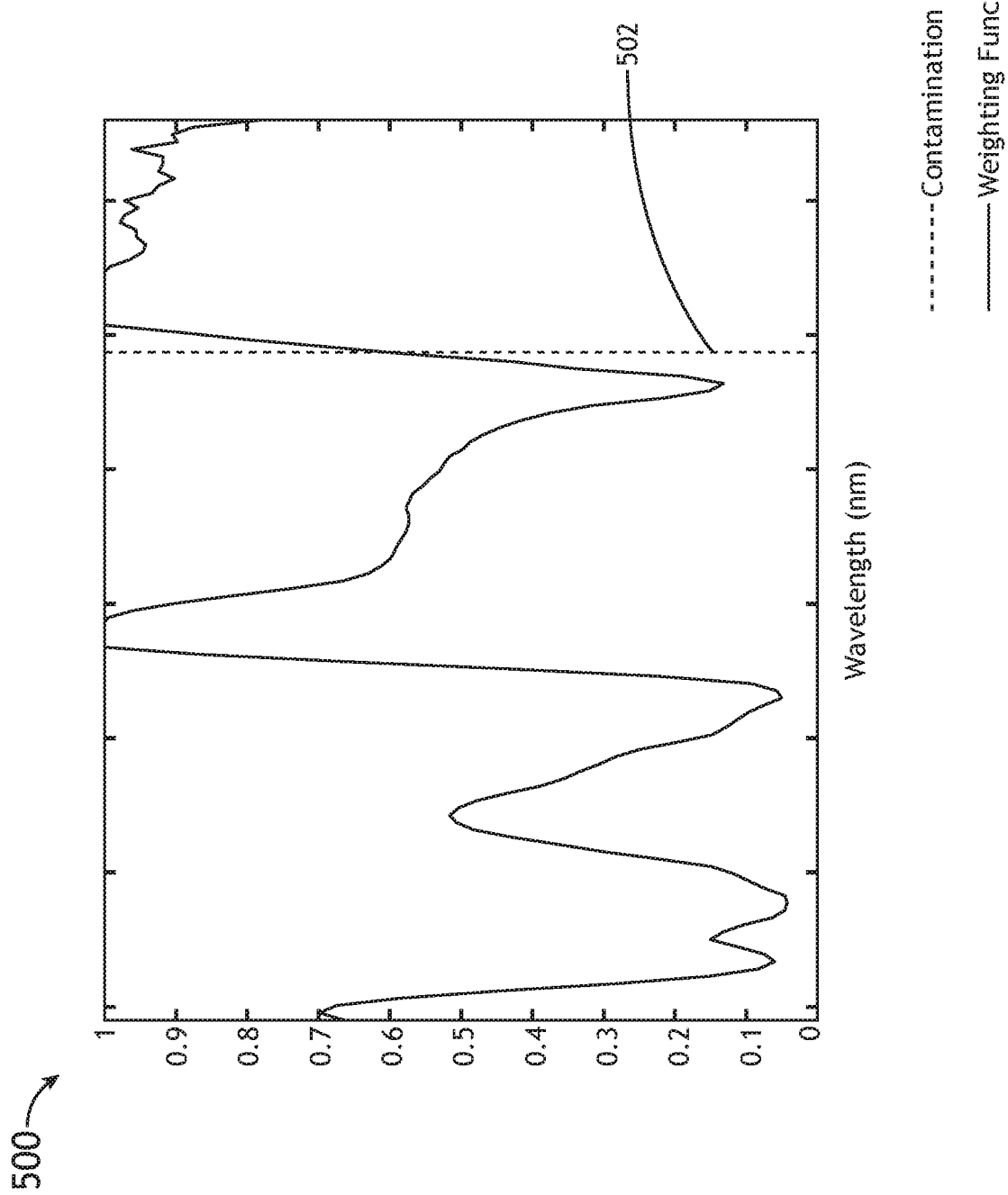
FIG. 5 is a plot illustrating weights generated based on comparing modified-pitch residuals associated with the modified-pitch target illustrated in FIG. 4B to test-pitch residuals associated with the test-pitch target illustrated in FIG. 4A, in accordance with one or more embodiments of the present disclosure.

Referring now to FIGS. 4A through 5, a simulated example illustrating the generation of a weighting function based on measurements of reference targets is described. FIG. 4A is a perspective view of a test-pitch target 402, in accordance with one or more embodiments of the present disclosure. FIG. 4B is a perspective view of a modified-pitch target 404, in accordance with one or more embodiments of the present disclosure. In this example, the model is designed to provide at least CD measurements of the top and bottom portions of the fin structures. Further, for this example, the model is based on 0-order diffraction and higher-order diffraction represents undesired diffraction orders that may contribute to noise in the measurement.

The test-pitch target 402 illustrated in FIG. 4A includes a three-dimensional grating structure including overlapping features in two layers. The test-pitch target 402 may be, but is not required to be, suitable as a large-pitch SRAM target for generating metrology measurements representative of SRAM device features. For example, the test-pitch target 402 includes a first layer 406 including first-layer features 408, a second layer 410 including second-layer features 412, and a third layer 414 (e.g., a substrate layer) without any features. The first-layer features 408 and the second-layer features 412 each include two sets of fin structures (e.g., a first set 416 and a second set 418), where the fin structures are periodically distributed with a pitch 420 of 1.25 micrometers (μm) along the Y-direction and a pitch 422 of 2.5 micrometers along the X-direction. For instance, the two sets of fin structures may be, but are not required to be, fabricated by making a cut through the fin structures along the Y-direction. The first-layer features 408 and the second-layer features 412 may overlap as illustrated in FIG. 4A, but are not required to overlap.

The modified-pitch target 404 illustrated in FIG. 4B includes a two-dimensional grating structure that is substantially the same as the test-pitch target 402, with the exception that the first-layer features 408 and the second-layer features 412 each include a single set of fin structures. For example, the modified-pitch target 404 corresponds to the test-pitch target 402 without the cut-line along the Y-direction. In this regard, the modified-pitch target 404 may have substantially the same attributes as the test-pitch target 402 such as, but not limited to, a CD of the fin structures (e.g., along the Y-direction), fin height, pitch along the Y-direction, layer thicknesses, layer compositions, or layer refractive indices.

FIG. 5 is a plot 500 illustrating weights generated based on comparing modified-pitch residuals associated with the modified-pitch target 404 illustrated in FIG. 4B to test-pitch residuals associated with the test-pitch target 402 illustrated in FIG. 4A, in accordance with one or more embodiments of the present disclosure. In this regard, the weighting function was generated using the steps illustrated in FIG. 3. For example, the weights may correspond to a weighting function suitable for, but not limited to, a maximum likelihood estimator.

The modified-pitch residuals and the test-pitch residuals were each generated as averages of residuals from thirteen measurements, where the thirteen measurements were generated by perturbing various attributes of the modified-pitch target 404 and the test-pitch target 402 such as, but not limited to, the pitch of the fin structures (e.g., the first-layer features 408 and the second-layer features 412 along the Y-direction, the top and bottom CD of the fin structures, the material attributes of the sample layers, and the separation between sets of fin structures along the X-direction for the test-pitch target 402. In this way, the perturbations may be representative of deviations of the fabrication process.

FIG. 5 also illustrates the contamination cutoff wavelength 502, below which at least some undesired higher-order diffraction is captured (e.g., by the scatterometry metrology tool 102). As illustrated in FIG. 5, the weights generated using this technique have non-zero values for the entire spectral range, including wavelengths below the cutoff wavelength 502. This extension of the usable wavelengths thus enables the utilization of a significant portion of the bandwidth of the scatterometry metrology tool 102 including wavelengths at which undesired higher-order diffraction is captured, but has a limited impact on the accuracy of the measurement.

Additionally, as also illustrated in FIG. 5, the generating weights based on comparing modified-pitch residuals to test-pitch residuals may compensate for additional errors (e.g., modeling errors and/or unmodeled errors). This can be seen by the reduction of the weighting function for certain values above the cutoff wavelength 502.

The accuracy of the weighting function in FIG. 5 was characterized by comparing the quality of the fit obtained using the weighting function to a full simulation including higher-order diffraction. In this case, regression of scatterometry data from the test-pitch target 402 incorporating a full simulation of high-order diffraction obtained a chi-square fitting metric value of 282.5, which is used as a baseline. In comparison, regression of scatterometry data from the test-pitch target 402 incorporating only 0-order diffraction and a uniform weighting scheme (e.g., no weights applied to correct for higher-order contamination) resulted in a chi-square value of 435.8, which indicates a relatively poor fit to the model. Further, applying the weighting function of FIG. 5 resulted in a chi-square value of 297.4, which indicates a relatively good fit to the model and results comparable to the full simulation.

It is noted herein that generating a weighting function based on comparisons of residuals from reference targets as described herein may enable accurate fits to a model without requiring any calculations of undesired diffraction orders or their associated impact.

Referring now to FIGS. 6 and 7, generating a weighting function by estimating the impact of contamination of undesired diffraction orders is described in greater detail. This approach may be used instead of, or in addition to, the generation of a weighting function based on residuals from reference targets as described previously herein.

In one embodiment, a weighting function is generated based on estimating a total contamination intensity associated with portions of undesired diffracted orders captured by the scatterometry metrology tool 102. For example, weights may scale with the total contamination intensity over a selected range.

The total contamination intensity associated with undesired diffraction orders may be estimated in a variety of ways in accordance with the present disclosure. It is recognized herein that the weighting function does not necessarily need to be determined with the same level of precision as the underlying model. Whereas the model provides a relationship between scatterometry data (e.g., scattered, reflected, and/or diffracted light captured by the scatterometry metrology tool 102) and attributes of the sample being measured, weighting function merely adjusts the relative impact of scatterometry data at certain wavelengths when fit to the model. Accordingly, it may be the case that approximations or estimations that are otherwise unsuitable for use within the model may be suitable for generating the weighting function to be applied to the model.

FIG. 6 is a flow diagram 600 illustrating sub-steps for generating a weighting function based on estimating a total contamination intensity associated with portions of undesired diffracted orders captured by the scatterometry metrology tool 102, in accordance with one or more embodiments of the present disclosure. For example, the flow diagram 600 may represent sub-steps associated with step 204 of FIG. 2. It is to be understood, however, that the model below is provided solely for illustrative purposes and should not be interpreted as limiting.

In one embodiment, step 204 includes a sub-step 602 of estimating a captured intensity associated with one or more undesired diffraction orders of light for wavelengths of interest (e.g., wavelengths within the spectral range of the scatterometry metrology tool 102). A captured intensity associated with an undesired diffraction order at a particular wavelength may be estimated using any technique known in the art including, but not limited to, ray-tracing techniques, RCWA techniques, direct measurement of one or more undesired diffraction orders coupled with a model providing sufficient order separation, or the like. Further, a captured intensity associated with an undesired diffraction order may be estimated using any combination of techniques.

In one embodiment, the contamination intensity associated with each diffraction order is estimated using a ray-tracing model. For example, a ray-tracing model may consider light rays projecting from the illumination aperture to an infinitesimally small focused spot size on the sample and the corresponding projection of rays emanating from the sample to the collection aperture associated with various diffraction orders. Accordingly, the contamination intensity associated with each diffraction order may be determined based on the extent to which light from each diffraction order passes through the collection aperture.

A ray-tracing model may be, but is not required to be, implemented using the following formulation. In one embodiment, a ray-tracing model may trace illumination rays (e.g., the illumination beam 112) projecting from at least a portion of the illumination aperture to an infinitesimally small focused spot size on the sample. For example, rays from points along a two-dimensional curve representing the illumination aperture (e.g., a border of the illumination aperture) may be traced.

For a target having pitch values $d_x$ and $d_y$ along the X and Y directions, respectively, a reciprocal lattice may be generated:

$$\vec{p_1} = d_x \hat{x} \quad (2)$$

$$\vec{p_2} = d_y(\cos\theta_{OA}\hat{x} + \sin\theta_{OA}\hat{y})$$

$$\vec{k_1} = 2\pi \frac{\vec{p_2} \times \hat{z}}{\vec{p_1} \cdot (\vec{p_2} \times \hat{z})}$$

$$\vec{k_2} = 2\pi \frac{\hat{z} \times \vec{p_1}}{\vec{p_2} \cdot (\hat{z} \times \vec{p_1})},$$

where $\theta_{OA}$ is an orthogonality angle defined as the angle of the unit cell between the X and Y pitches (e.g., $d_x$ and $d_y$), $\vec{p_1}$ and $\vec{p_2}$ represent principal vectors in real space, and $\vec{k_1}$ and $\vec{k_2}$ represent the corresponding principal vectors in wave space.

Further, the wave vectors of rays emanating from the sample may be written as a function of an incident wave vector $\vec{k_0}$ and diffraction orders $m_x$ and $m_y$ in the X and Y directions, respectively:

$$k_x = k_{0,x} + m_x \vec{k_1} \cdot \hat{x} + m_y \vec{k_2} \cdot \hat{x}$$

$$k_y = k_{0,y} + m_x \vec{k_1} \cdot \hat{y} + m_y \vec{k_2} \cdot \hat{y},$$

$$k_z^2 = k_0^2 - k_x^2 - k_y^2 \quad (3)$$

where the values of $k_z^2$ may be confined to positive values, excluding the evanescent waves.

From this, the rays emanating from the sample may be projected onto a plane containing the collection aperture. Further, the area of illumination over the collection aperture for each of the diffracted orders may be determined by identifying which ray projections fall within an interior of the collection aperture, determining edge intersection points between the projected rays and the aperture, and finding a polygon determined by the interior points and the edge intersection points for each of the diffracted orders.

Finally, area of illumination over the collection aperture for all of the undesired may be used to determine the intensity of the diffracted order (e.g., the contamination intensity) passing through the collection aperture.

In one embodiment, step 204 includes a sub-step 604 of estimating a total contamination intensity associated with combined captured intensities of the undesired diffraction orders. The total contamination intensity associated with combined captured intensities of the undesired diffraction orders may be estimated using a variety of techniques. In one embodiment, the total contamination intensity is generated as a sum of captured intensities of the undesired diffraction orders passing through the collection aperture. In another embodiment, the various captured intensities of the undesired diffraction orders are scaled based on the area of the contamination in the collection pupil and then summed. In this regard, both the intensity of captured light associated with an undesired diffraction order and the extent to which the captured light covers the collection aperture may be considered as contributing to the impact of the contamination.

For example, the total contamination intensity ($I_{C,TOT}(\lambda)$) may be, but is not required to be, represented as:

$$I_{C,TOT}(\lambda) = \sum_{m_x, m_y} \frac{A_C(\lambda, m_x, m_y)}{A_{Coll}} I_C(\lambda, m_x, m_y), \quad (4)$$

where $m_x$ and $m_y$ represent diffraction orders in two orthogonal directions, $I_C(\lambda, m_x, m_y)$ represents the average intensity of the contamination order ($m_x$, $m_y$) over a collection numerical aperture of the scatterometry metrology tool 102, $A_{Coll}$ represents the area of the collection aperture, and $A_C(\lambda, m_x, m_y)$ represents the area of the contamination over the collection aperture.

In another embodiment, step 204 includes a sub-step 606 of generating the weighting function based on the total contamination intensity.

A weighting function may then be generated based on the estimated total contamination intensity using a variety of techniques. In one embodiment, an upper threshold ($n_1$) is defined with respect to a reference level ($I_0$) to describe conditions where the total contamination intensity is estimated to overwhelm the signal. For wavelengths satisfying this condition, the weight may be set to 0 to exclude the associated scatterometry data from the analysis. In another embodiment, a lower threshold ($n_0$) may be defined with respect to the reference level ($I_0$) to describe conditions where the total contamination intensity is estimated to be negligent. For wavelengths satisfying this condition, the weight may be set to 1 to provide full weight to the associated scatterometry data. In another embodiment, the weights may transition between 1 and 0 for wavelengths between the upper and lower thresholds. For example, the weighting function ($W_{HO}(\lambda)$) may follow a linear relationship between 1 and 0 as described in equation 5:

$$W_{HO}(\lambda) = \begin{cases} 0 & I_{C,TOT}(\lambda) > n_0 I_0(\lambda) \\ 1 & I_{C,TOT}(\lambda) \leq n_1 I_0(\lambda) \\ \frac{n_0 I_0(\lambda) - I_{C,TOT}(\lambda)}{I_0(\lambda)(n_0 - n_1)} & \text{else} \end{cases} \quad (5)$$

It is recognized herein that any combination of upper and lower thresholds may be utilized to generate weights based on the total contamination intensity. For example, either $n_0$ or $n_1$ may be set to 0. Further, the values of the upper and lower thresholds may be determined using any technique known in the art. In one embodiment, the upper and/or lower thresholds are determined ad-hoc. For example, the upper and/or lower thresholds may be determined to provide a target baseline fitting metric (e.g., a chi-squared value, or the like). In another embodiment, the upper and/or lower thresholds are determined based on the expected noise of the signal. For example, signals having a selected noise level (e.g., $3\sigma$, or the like) may be reduced or eliminated.

The reference level ($I_0$) may be selected using any metric. In one embodiment, the reference level ($I_0$) is selected to correspond to a noise variance level ($\sigma(\lambda)$) associated with any selected signal such as, but not limited to, the collected signal or the contamination intensity. In another embodiment, the reference level ($I_0$) is selected based on one or more post-processed signals such as, but not limited to, a reflectivity measurement, a harmonic signal (e.g., associated with a spectroscopic ellipsometry measurement, or the like), or a calculated sample Mueller.

It is to be understood, however, that the above example describing a weighting function as a linear function between two bounding conditions is provided solely for illustrative purposes and should not be interpreted as limiting. In another embodiment, the weighting function may be defined with a non-linear relationship between the upper and lower thresholds. In a further embodiment, no lower threshold is defined and non-zero weights may be applied to all wavelengths within the spectral range of the scatterometry metrology tool 102.

FIG. 7 is a plot 700 illustrating weights generated based on an estimated total contamination intensity associated with measurement of the test-pitch target 402 illustrated in FIG. 4A, in accordance with one or more embodiments of the present disclosure. In this regard, the weighting function may be generated using the steps illustrated in FIG. 6. Further, the weights in FIG. 7 were generated using an upper limit ($n_0$) of 3 and a lower limit ($n_0$) of 0.

As illustrated in FIG. 7, the weights generated using this technique have non-zero values for the entire spectral range, including wavelengths below the cutoff wavelength 502. This extension of the usable wavelengths thus enables the utilization of a significant portion of the bandwidth of the scatterometry metrology tool 102 including wavelengths at which undesired higher-order diffraction is captured, but has a limited impact on the accuracy of the measurement.

Additionally, as also illustrated in FIG. 7, the generating weights based on comparing modified-pitch residuals to test-pitch residuals may compensate for additional errors (e.g., modeling errors and/or unmodeled errors). This can be seen by the reduction of the weighting function for certain values above the cutoff wavelength 502.

The accuracy of the weighting function in FIG. 7 was characterized by comparing the quality of the fit obtained using the weighting function to a full simulation including higher-order diffraction as described previously herein in the context of FIG. 5. Applying the weighting function of FIG. 7 resulted in a chi-square value of 215.5, which indicates a relatively good fit to the model and results comparable to the full simulation having a chi-square value of 282.5.

Figure 8:
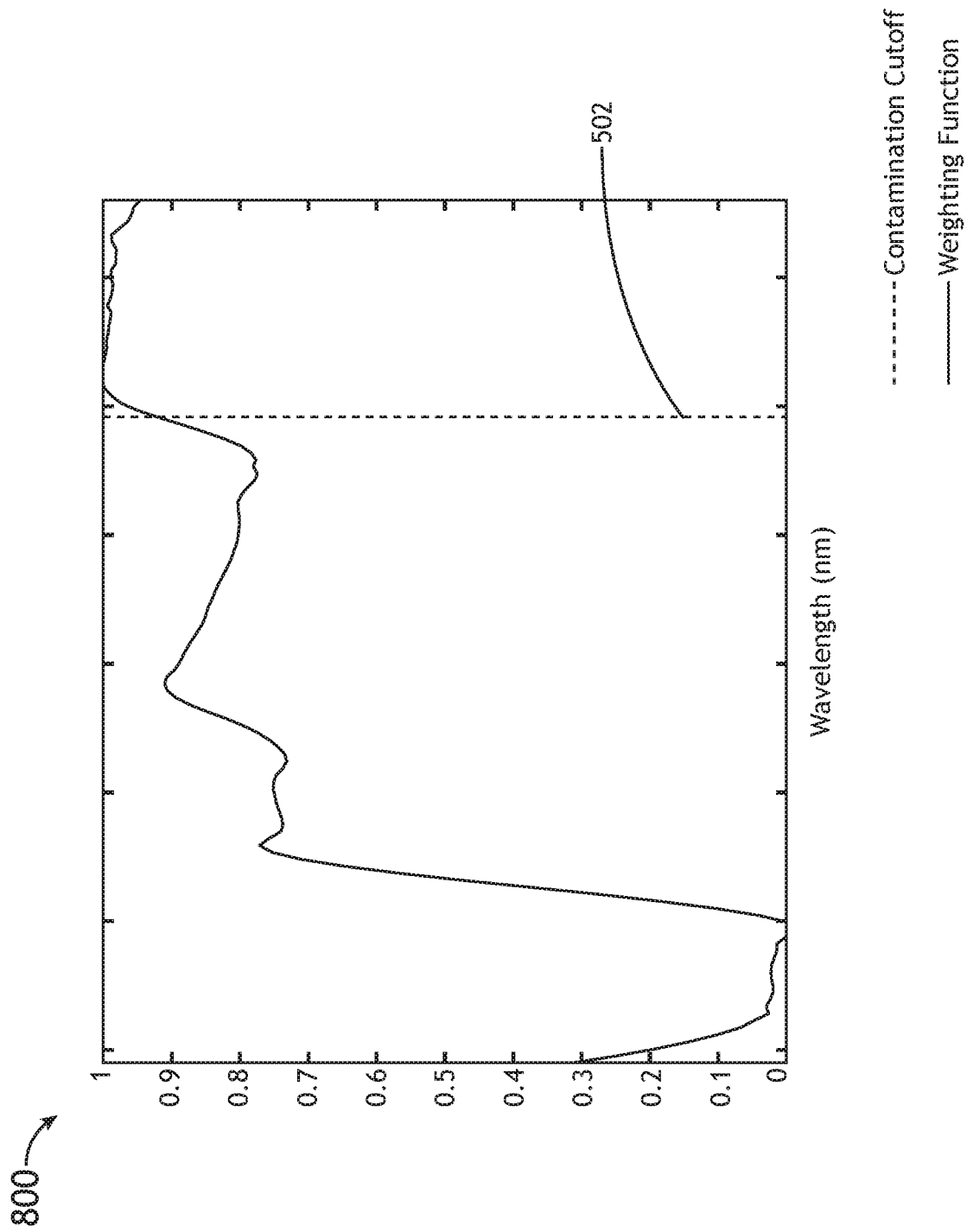
FIG. 8 is a plot illustrating weights generated based on a linear combination of a residual weighting method and a ray-tracing method, in accordance with one or more embodiments of the present disclosure.

Referring now to FIG. 8, in some embodiments, a weighting function may incorporate a combination of two or more weighting functions. For example, any combination of weighting functions described in accordance with the present disclosure may be combined into a single weighting function.

Weighting functions may be combined as any linear or non-linear combination. In one embodiment, a weighting function is a linear combination of $W_{Res}(\lambda)$ and $W_{HO}(\lambda)$ as described previously herein. For example, the weighting function may be represented as:

$$W(\lambda)=\alpha W_{Res}(\lambda)(1-\alpha)W_{HO}(\lambda) \qquad (6)$$

where $\alpha$ is a parameter controlling the relative weights of $W_{Res}(\lambda)$ and $W_{HO}(\lambda)$ in the combined weighting function $W(\lambda)$. Further, the value of $\alpha$ may be determined using any technique known in the art. In one embodiment, the upper and/or lower thresholds are determined ad-hoc. For example, the value of $\alpha$ may be determined to provide a target baseline fitting metric (e.g., a chi-squared value, or the like). By way of another example, the value of $\alpha$ may be determined to provide a selected performance relative to reference measurements from a high-precision metrology tool (e.g., a scanning electron microscope, a transmission electron microscope, or the like). For instance, one or more target sites having known values of a selected attribute (e.g., CD, or the like) may be measured using the high-precision metrology tool. The value of $\alpha$ may then be determined to provide a selected performance based on one or more metrics (e.g., R-squared, slope, offset, or the like) used to gauge the accuracy of the model-based approach relative to the measured values.

FIG. 8 is a plot 800 illustrating weights generated based on a linear combination of a residual weighting method and a ray-tracing method, in accordance with one or more embodiments of the present disclosure. Further, the weights in FIG. 7 were generated using a value of $\alpha$ equal to 0.75. The accuracy of the weighting function in FIG. 8 was characterized by comparing the quality of the fit obtained using the weighting function to a full simulation including higher-order diffraction as described previously herein in the context of FIG. 5. Applying the weighting function of FIG. 8 resulted in a chi-square value of 220.0, which indicates a relatively good fit to the model and results comparable to the full simulation having a chi-square value of 282.5.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system comprising:
   A controller configured to be communicatively coupled to a scatterometry tool, the controller including one or more processors configured to execute program instructions causing the one or more processors to:
      receive a model for measuring one or more selected attributes of a target including one or more features distributed in a selected pattern based on regression of spectroscopic scatterometry data from the scatterometry tool, wherein the scatterometry tool includes an illumination source and a detector for generating the spectroscopic scatterometry data, wherein the spectroscopic scatterometry data includes at least one of intensities or angles of light from the target in response to the illumination with a selected range of wavelengths;
      generate a weighting function for the model to de-emphasize portions of the spectroscopic scatterometry data associated with one or more wavelengths within the selected range of wavelengths at which light captured by the scatterometry tool when measuring the target is predicted to include one or more undesired diffraction orders;
      direct the spectroscopic scatterometry tool to generate spectroscopic scatterometry data of one or more measurement targets for the selected range of wavelengths, wherein the one or more measurement targets include fabricated features distributed in the selected pattern;
      receive the spectroscopic scatterometry data of the one or more measurement targets from the spectroscopic scatterometry tool;
      measure the one or more selected attributes for the one or more measurement targets based on regression of the spectroscopic scatterometry data of the one or more measurement targets to the model weighted by the weighting function.

2. The metrology system of claim 1, wherein generating the weighting function comprises:
   measuring the one or more selected attributes for one or more modified-pitch reference targets based on regression of spectroscopic scatterometry data of one or more modified-pitch reference targets, wherein the one or more modified-pitch reference targets include features distributed in the selected pattern with separations between features scaled such that light captured by the scatterometry tool when measuring the one or more modified-pitch reference targets is predicted to include a single diffraction order for the selected range of wavelengths;
   determining a modified-pitch residual between the spectroscopic scatterometry data of the one or more modified-pitch reference targets and the model;
   measuring the one or more selected attributes for one or more test-pitch reference targets based on regression of spectroscopic scatterometry data of one or more test-pitch reference targets, wherein the one or more test-pitch reference targets include features distributed in the selected pattern, wherein separations between features of the one or more test-pitch reference targets correspond to separations between features of the one or more measurement targets;

determining a test-pitch residual between spectroscopic scatterometry data of one or more large-pitch reference targets and the model;

generating the weighting function based on an absolute value of a ratio between the modified-pitch residual and a large-pitch residual.

3. The metrology system of claim 2, wherein the weighting function ($W(\lambda)$) comprises:

$$W(\lambda) = \left\| \frac{R_{MP}(\lambda)}{R_{TP}(\lambda)} \right\|,$$

where $R_{MP}(\lambda)$ represents the modified-pitch residual, $R_{TP}(\lambda)$ represents the test-pitch residual, and $\lambda$ represents wavelengths within the selected range of wavelengths.

4. The metrology system of claim 2, wherein the test-pitch residual is determined using a weighting scheme used to determine the modified-pitch residual.

5. The metrology system of claim 2, wherein the test-pitch residual is determined using a uniform weighting scheme.

6. The metrology system of claim 2, wherein the one or more modified-pitch reference targets comprises:
two or more modified-pitch reference targets, wherein a value of the modified-pitch residual at a particular wavelength within the range of wavelengths comprises:
an average value of two or more residuals associated with the two or more modified-pitch reference targets at the particular wavelength.

7. The metrology system of claim 2, wherein the one or more test-pitch reference targets comprises:
two or more test-pitch reference targets, wherein a value of the test-pitch residual at a particular wavelength within the range of wavelengths comprises:
an average value of two or more residuals associated with the two or more test-pitch reference targets at the particular wavelength.

8. The metrology system of claim 1, wherein generating the weighting function comprises:
estimating a captured intensity associated with each of the one or more undesired diffraction orders;
estimating a total contamination intensity associated with the captured intensities of each of the undesired diffraction orders; and
generating the weighting function based on the total contamination intensity.

9. The metrology system of claim 8, wherein the weighting function ($W(\lambda)$) comprises:

$$W(\lambda) = \begin{cases} 0 & I_{C,TOT}(\lambda) > n_0 I_0(\lambda) \\ 1 & I_{C,TOT}(\lambda) \le n_1 I_0(\lambda) \\ \frac{n_0 I_0(\lambda) - I_{C,TOT}(\lambda)}{I_0(\lambda) \cdot (n_0 - n_1)} & \text{else} \end{cases},$$

where $I_{C,TOT}(\lambda)$ represents the total contamination intensity, $I_0(\lambda)$ represents a reference intensity, $\lambda$ represents wavelengths within the selected range of wavelengths, and $n_0$ and $n_1$ represent bounding parameters.

10. The metrology system of claim 9, wherein the reference intensity comprises:
a noise variance of the spectroscopic scatterometry data.

11. The metrology system of claim 9, wherein the total contamination intensity comprises:

$$I_{C,TOT}(\lambda) = \sum_{m_x, m_y} \frac{A_C(\lambda, m_x, m_y)}{A_{Coll}} I_C(\lambda, m_x, m_y),$$

where $m_x$ and $m_y$ represent diffraction orders in two orthogonal directions, $I_C(\lambda, m_x, m_y)$ represents the average intensity of the contamination order ($m_x, m_y$) over a collection numerical aperture of the scatterometry tool, $A_{Coll}$ represents the area of the collection aperture, and $A_C(\lambda, m_x, m_y)$ represents the area of the contamination over the collection aperture.

12. The metrology system of claim 1, wherein generating the weighting function comprises:
measuring the one or more selected attributes for one or more modified-pitch reference targets based on regression of spectroscopic scatterometry data of one or more modified-pitch reference targets, wherein the one or more modified-pitch reference targets include features distributed in the selected pattern with separations between features scaled such that light captured by the scatterometry tool when measuring the one or more modified-pitch reference targets is predicted to include a single diffraction order for the selected range of wavelengths;
determining a modified-pitch residual between the spectroscopic scatterometry data of the one or more modified-pitch reference targets and the model;
measuring the one or more selected attributes for one or more test-pitch reference targets based on regression of spectroscopic scatterometry data of one or more test-pitch reference targets, wherein the one or more test-pitch reference targets include features distributed in the selected pattern, wherein separations between features of the one or more test-pitch reference targets correspond to separations between features of the one or more measurement targets;
determining a test-pitch residual between spectroscopic scatterometry data of the one or more large-pitch reference targets and the model;
generating a first weighting sub-function based on an absolute value of a ratio between the modified-pitch residual and a large-pitch residual;
estimating a captured intensity associated with each of the one or more undesired diffraction orders;
estimating a total contamination intensity associated with the captured intensities of each of the undesired diffraction orders; and
generating a second weighting sub-function based on the total contamination intensity.

13. The metrology system of claim 12, wherein the first weighting sub-function ($W_{Res}(\lambda)$) comprises:

$$W_{Res}(\lambda) = \left\| \frac{R_{MP}(\lambda)}{R_{TP}(\lambda)} \right\|,$$

where $R_{MP}(\lambda)$ represents the modified-pitch residual, $R_{TP}(\lambda)$ represents the test-pitch residual, and $\lambda$ represents wavelengths within the selected range of wavelengths, wherein the second weighting sub-function ($W_{Ho}(\lambda)$) comprises:

$$W_{HO}(\lambda) = \begin{cases} 0 & I_{C,TOT}(\lambda) > n_0 I_0(\lambda) \\ 1 & I_{C,TOT}(\lambda) \le n_0 I_0(\lambda) \\ \dfrac{n_0 I_0(\lambda) - I_{C,TOT}(\lambda)}{I_0(\lambda) - (n_0 - n_1)} & \text{else} \end{cases},$$

where $I_{C,TOT}(\lambda)$ represents the total contamination intensity, $I_0(\lambda)$ represents a reference intensity, $\lambda$ represents wavelengths within the selected range of wavelengths, and $n_0$ and $n_1$ represent bounding parameters, wherein the weighting function ($W(\lambda)$) comprises:

$W(\lambda) = \alpha W_{HO}(\lambda) + (1-\alpha) W_{Res}(\lambda)$, where a is a parameter defining a relative weight of a first and a second sub-weighting functions.

14. The metrology system of claim 13, wherein the reference intensity comprises:

a noise variance of the spectroscopic scatterometry data.

15. The metrology system of claim 13, wherein the total contamination intensity comprises:

$$I_{C,TOT}(\lambda) = \sum_{m_x, m_y} \frac{A_C(\lambda, m_x, m_y)}{A_{Coll}} I_C(\lambda, m_x, m_y),$$

where $m_x$ and $m_y$ represent diffraction orders in two orthogonal directions, $I_C(\lambda, m_x, m_y)$ represents the average intensity of the contamination order ($m_x$, $m_y$) over a collection numerical aperture of the scatterometry tool, $A_{Coll}$ represents the area of the collection aperture, and $A_C(\lambda, m_x, m_y)$ represents the area of the contamination over the collection aperture.

16. The metrology system of claim 1, wherein the scatterometry tool comprises:

the illumination source configured to generate an illumination beam including the selected range of wavelengths;

one or more illumination optics to direct the illumination beam to a sample; sample including the target;

one or more collection optics to collect light from the sample in response to the illumination beam; and the detector configured to generate the spectroscopic scatterometry data based on detecting at least a portion of light collected by the one or more collection optics.

17. A metrology system comprising:

a scatterometry tool including an illumination source and a detector for generating spectroscopic scatterometry data of a target, wherein the spectroscopic scatterometry data includes at least one of intensities or angles of light from the target in response to the illumination with a selected range of wavelengths; and a controller communicatively coupled to the scatterometry tool, the controller including one or more processors configured to execute program instructions causing the one or more processors to:

receive a model for measuring one or more selected attributes of the target including one or more features distributed in a selected pattern based on regression of spectroscopic scatterometry data from the scatterometry tool for the selected range of wavelengths;

generate a weighting function for the model to de-emphasize portions of the spectroscopic scatterometry data associated with one or more wavelengths within the selected range of wavelengths at which light captured by the scatterometry tool when measuring the target is predicted to include one or more undesired diffraction orders;

direct the spectroscopic scatterometry tool to generate spectroscopic scatterometry data of one or more measurement targets for the selected range of wavelengths, wherein the one or more measurement targets include fabricated features distributed in the selected pattern; and measure the one or more selected attributes for the one or more measurement targets based on regression of the spectroscopic scatterometry data of the one or more measurement targets to the model weighted by the weighting function.

18. The metrology system of claim 17, wherein the scatterometry tool comprises:

the illumination source configured to generate an illumination beam including the selected range of wavelengths;

one or more illumination optics to direct the illumination beam to a sample including the target;

one or more collection optics to collect light from the sample in response to the illumination beam; and the detector configured to generate the spectroscopic scatterometry data based on detecting at least a portion of light collected by the one or more collection optics.

19. The metrology system of claim 17, wherein the scatterometry tool comprises:

a spectroscopic reflectometry tool.

20. The metrology system of claim 17, wherein the scatterometry tool comprises:

a spectroscopic ellipsometry tool.

21. The metrology system of claim 17, wherein generating the weighting function comprises:

measuring the one or more selected attributes for one or more modified-pitch reference targets based on regression of spectroscopic scatterometry data of one or more modified-pitch reference targets, wherein the one or more modified-pitch reference targets include features distributed in the selected pattern with separations between features scaled such that light captured by the scatterometry tool when measuring the one or more modified-pitch reference targets is predicted to include a single diffraction order for the selected range of wavelengths;

determining a modified-pitch residual between the spectroscopic scatterometry data of the one or more modified-pitch reference targets and the model;

measuring the one or more selected attributes for one or more test-pitch reference targets based on regression of spectroscopic scatterometry data of one or more test-pitch reference targets, wherein the one or more test-pitch reference targets include features distributed in the selected pattern, wherein separations between features of the one or more test-pitch reference targets correspond to separations between features of the one or more measurement targets;

determining a test-pitch residual between spectroscopic scatterometry data of one or more large-pitch reference targets and the model;

generating the weighting function based on an absolute value of a ratio between the modified-pitch residual and a large-pitch residual.

22. The metrology system of claim 21, wherein the weighting function ($W(\lambda)$) comprises:

$$W(\lambda) = \left\| \frac{R_{MP}(\lambda)}{R_{TP}(\lambda)} \right\|,$$

where $R_{MP}(\lambda)$ represents the modified-pitch residual, $R_{TP}(\lambda)$ represents the test-pitch residual, and $\lambda$ represents wavelengths within the selected range of wavelengths.

23. The metrology system of claim 17, wherein generating the weighting function comprises:
   estimating a captured intensity associated with each of the one or more undesired diffraction orders;
   estimating a total contamination intensity associated with the captured intensities of each of the undesired diffraction orders; and
   generating the weighting function based on the total contamination intensity.

24. The metrology system of claim 23, wherein the weighting function ($W(\lambda)$) comprises:

$$W(\lambda) = \begin{cases} 0 & I_{C,TOT}(\lambda) > n_0 I_0(\lambda) \\ 1 & I_{C,TOT}(\lambda) \le n_0 I_0(\lambda) \\ \frac{n_0 I_0(\lambda) - I_{C,TOT}(\lambda)}{I_0(\lambda) - (n_0 - n_1)} & \text{else} \end{cases},$$

where $I_{C,TOT}(\lambda)$ represents the total contamination intensity, $I_0(\lambda)$ represents a reference intensity, $\lambda$ represents wavelengths within the selected range of wavelengths, and $n_0$ and $n_1$ represent bounding parameters.

25. The metrology system of claim 24, wherein the reference intensity comprises:
   a noise variance of the spectroscopic scatterometry data.

26. The metrology system of claim 24, wherein the total contamination intensity comprises:

$$I_{C,TOT}(\lambda) = \sum_{m_x,m_y} \frac{Ac(\lambda, m_x, m_y)}{A_{Coll}} I_C(\lambda, m_x, m_y),$$

where $m_x$ and $m_y$ represent diffraction orders in two orthogonal directions, $I_C(\lambda, m_x, m_y)$ represents an average intensity of a contamination order $(m_x, m_y)$ over a collection numerical aperture of the scatterometry tool, $A_{Coll}$ represents an area of the collection aperture, and $A_C(\lambda, m_x, m_y)$ represents an area of the contamination over the collection aperture.

27. The metrology system of claim 17, wherein generating the weighting function comprises:
   measuring the one or more selected attributes for one or more modified-pitch reference targets based on regression of spectroscopic scatterometry data of one or more modified-pitch reference targets, wherein the one or more modified-pitch reference targets include features distributed in the selected pattern with separations between features scaled such that light captured by the scatterometry tool when measuring the one or more modified-pitch reference targets is predicted to include a single diffraction orders for the selected range of wavelengths;
   determining a modified-pitch residual between the spectroscopic scatterometry data of the one or more modified-pitch reference targets and the model;
   measuring the one or more selected attributes for one or more test-pitch reference targets based on regression of spectroscopic scatterometry data of one or more test-pitch reference targets, wherein the one or more test-pitch reference targets include features distributed in the selected pattern, wherein the separations between features of the one or more test-pitch reference targets correspond to the separations between features of the one or more measurement targets;
   determining a test-pitch residual between spectroscopic scatterometry data of the one or more large-pitch reference targets and the model;
   generating a first weighting sub-function based on an absolute value of a ratio between the modified-pitch residual and a large-pitch residual;
   estimating a captured intensity associated with each of the one or more undesired diffraction orders;
   estimating a total contamination intensity associated with the captured intensities of each of the undesired diffraction orders; and
   generating a second weighting sub-function based on the total contamination intensity.

28. The metrology system of claim 27, wherein the first weighting sub-function ($W_{Res}(\lambda)$) comprises:

$$W_{Res}(\lambda) = \left\| \frac{R_{MP}(\lambda)}{R_{TP}(\lambda)} \right\|,$$

where $R_{MP}(\lambda)$ represents the modified-pitch residual, $R_{TP}(\lambda)$ represents the test-pitch residual, and $\lambda$ represents wavelengths within the selected range of wavelengths, wherein the second weighting sub-function ($W_{Ho}(\lambda)$) comprises:

$$W_{HO}(\lambda) = \begin{cases} 0 & I_{C,TOT}(\lambda) > n_0 I_0(\lambda) \\ 1 & I_{C,TOT}(\lambda) \le n_1 I_0(\lambda) \\ \frac{n_0 I_0(\lambda) - I_{C,TOT}(\lambda)}{I_0(\lambda) - (n_0 - n_1)} & \text{else} \end{cases},$$

where $I_{C,TOT}(\lambda)$ represents the total contamination intensity, $I_0(\lambda)$ represents a reference intensity, $\lambda$ represents wavelengths within the selected range of wavelengths, and $n_0$ and $n_1$ represent bounding parameters, wherein the weighting function ($W(\lambda)$) comprises:
   $W(\lambda) = \alpha W_{HO}(\lambda) + (1-\alpha) W_{Res}(\lambda)$, where $\alpha$ is a parameter defining a relative weight of a first and a second sub-weighting functions.

29. The metrology system of claim 28, wherein the reference intensity comprises:
   a noise variance of the spectroscopic scatterometry data.

30. The metrology system of claim 28, wherein the total contamination intensity comprises:

$$I_{C,TOT}(\lambda) = \sum_{m_x,m_y} \frac{Ac(\lambda, m_x, m_y)}{A_{Coll}} I_C(\lambda, m_x, m_y),$$

where $m_x$ and $m_y$ represent diffraction orders in two orthogonal directions, $I_C(\lambda, m_x, m_y)$ represents the average intensity of a contamination order $(m_x, m_y)$ over a collection numerical aperture of the scatterometry tool, $A_{Coll}$ represents an area of the collection aperture, and $A_C(\lambda, m_x, m_y)$ represents an area of the contamination over the collection aperture.

31. A metrology method comprising:
   receiving a model for measuring one or more selected attributes of a target including one or more features distributed in a selected pattern based on regression of spectroscopic scatterometry data from a scatterometry tool, wherein the scatterometry tool includes an illumination source and a detector for generating the spectroscopic scatterometry data, wherein the spectroscopic scatterometry data includes at least one of intensities or angles of light from the target in response to the illumination with a selected range of wavelengths;

generating a weighting function for the model to de-emphasize portions of the spectroscopic scatterometry data associated with one or more wavelengths within the selected range of wavelengths at which light captured by the scatterometry tool when measuring the target is predicted to include one or more undesired diffraction orders;

directing the spectroscopic scatterometry tool to generate spectroscopic scatterometry data of one or more measurement targets for the selected range of wavelengths, wherein the one or more measurement targets include fabricated features distributed in the selected pattern; and measuring the one or more selected attributes for the one or more measurement targets based on regression of the spectroscopic scatterometry data of the one or more measurement targets to the model weighted by the weighting function.

* * * * *